(12) United States Patent
Hjartarson et al.

(10) Patent No.: US 11,092,762 B2
(45) Date of Patent: Aug. 17, 2021

(54) SURFACE MOUNT PACKAGING FOR SINGLE MODE ELECTRO-OPTICAL MODULE

(71) Applicant: ElectroPhotonic-IC Inc., Kanata (CA)

(72) Inventors: Gudmundur A. Hjartarson, Ottawa (CA); Craig Elliott, Ottawa (CA)

(73) Assignee: ElectroPhotonic-IC Inc., Kanata (CA)

( * ) Notice: Subject to any disclaimer, the term of this patent is extended or adjusted under 35 U.S.C. 154(b) by 0 days.

(21) Appl. No.: 16/491,712

(22) PCT Filed: Jan. 25, 2019

(86) PCT No.: PCT/CA2019/050090
§ 371 (c)(1),
(2) Date: Sep. 6, 2019

(87) PCT Pub. No.: WO2019/148270
PCT Pub. Date: Aug. 8, 2019

(65) Prior Publication Data
US 2020/0363598 A1 Nov. 19, 2020

Related U.S. Application Data

(60) Provisional application No. 62/625,291, filed on Feb. 1, 2018.

(51) Int. Cl.
*G02B 6/42* (2006.01)
*G02B 6/38* (2006.01)
(Continued)

(52) U.S. Cl.
CPC ......... *G02B 6/4292* (2013.01); *G02B 6/3878* (2013.01); *G02B 6/421* (2013.01);
(Continued)

(58) Field of Classification Search
None
See application file for complete search history.

(56) References Cited

U.S. PATENT DOCUMENTS 5,857,054 A * 1/1999 Thomas ............... G02B 6/4246
385/134
7,192,200 B2 * 3/2007 Casati .................. G02B 6/4204
385/89

(Continued)

FOREIGN PATENT DOCUMENTS

JP        2005156969 A  *  6/2005

OTHER PUBLICATIONS

Holmbom et al. ("Electrodeposition, Growth Morphology & Melting Characteristics of Gold-Tin Eutectic Alloys", Plating & Surface Finishing, 85(4):66-73, Apr. 1998) (Year: 1998).*

(Continued)

*Primary Examiner* — Michelle R Connelly
(74) *Attorney, Agent, or Firm* — Miltons IP/p.i.

(57) ABSTRACT

An electro-optical module is provided in the form of a Ceramic Ball Grid Array (CBGA) optical package with a detachable fiber optic connector. The electro-optical module is surface mountable on a printed circuit boards (PCB) using standard electronics pick-and-place and reflow manufacturing technology. A module housing array of ultra-high-speed single mode fiber based optical transmit and/or receive devices provides for high density fiber interconnections and can be mounted directly on a PCB in close proximity to associated electronics. The resulting shorter electrical interconnects reduce losses and distortion of the high frequency electrical signals enabling lower power signals and lower error rates on the interfaces, for applications such as high-speed data center interconnects. Shorter electrical interconnects may also allow for simpler clock and data recovery circuits or, in some cases, complete elimination of some of these circuits.

30 Claims, 21 Drawing Sheets

(51) Int. Cl.
*G02B 6/43* (2006.01)
*H04B 10/50* (2013.01)
*H04B 10/60* (2013.01)
*H04B 10/40* (2013.01)

(52) U.S. Cl.
CPC ........... *G02B 6/428* (2013.01); *G02B 6/4249* (2013.01); *G02B 6/4285* (2013.01); *G02B 6/43* (2013.01); G02B 6/4228 (2013.01); G02B 6/4238 (2013.01); G02B 6/4245 (2013.01); G02B 6/4246 (2013.01); *H04B 10/40* (2013.01); *H04B 10/50* (2013.01); *H04B 10/60* (2013.01)

(56) References Cited

U.S. PATENT DOCUMENTS

| 7,427,164 | B2 | 9/2008 | Schempp | |
|---|---|---|---|---|
| 7,544,527 | B2 | 6/2009 | Benner et al. | |
| 7,731,433 | B1* | 6/2010 | Heinemann | G02B 6/4246 385/93 |
| 8,834,041 | B2* | 9/2014 | Ertel | G02B 6/3817 385/89 |
| 10,466,430 | B1* | 11/2019 | Krause | G02B 6/3897 |
| 2005/0156310 | A1* | 7/2005 | Benner | G02B 6/4249 257/712 |
| 2006/0056763 | A1* | 3/2006 | Xu | G02B 6/4292 385/33 |
| 2006/0072882 | A1* | 4/2006 | Casati | G02B 6/4204 385/92 |
| 2009/0010600 | A1 | 1/2009 | Kim et al. | |
| 2011/0165707 | A1* | 7/2011 | Lott | H01L 31/028 438/27 |
| 2012/0326290 | A1* | 12/2012 | Andry | G02B 6/428 257/680 |
| 2018/0203187 | A1* | 7/2018 | Doerr | G02B 6/12 |

OTHER PUBLICATIONS

International Search Report issued on International Application No. PCT/CA2019/050090 dated Apr. 18, 2019; 4 pages.

* cited by examiner

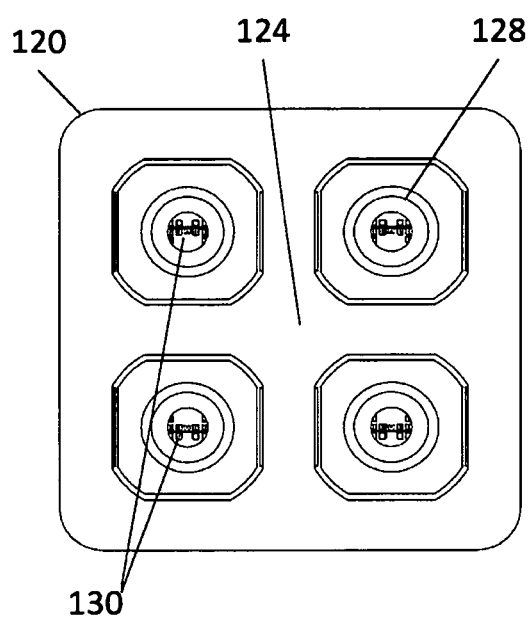
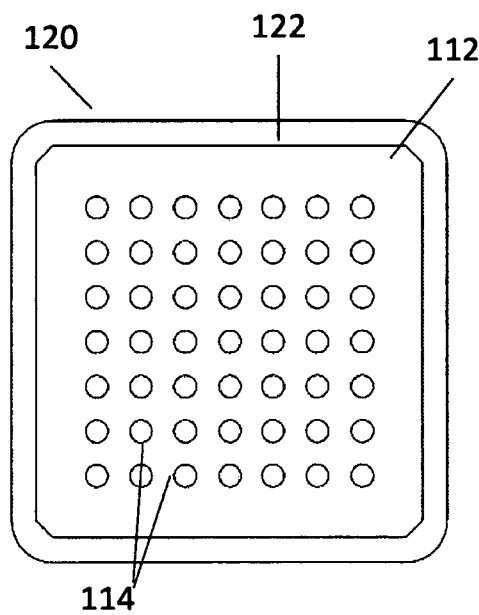
Fig. 5      Fig. 6
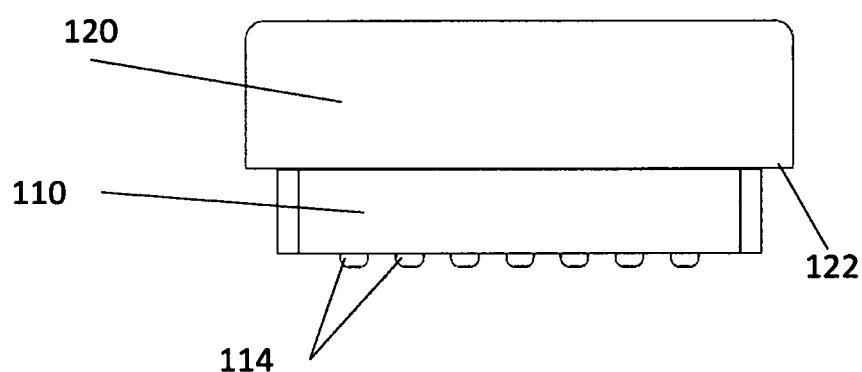
Fig. 7

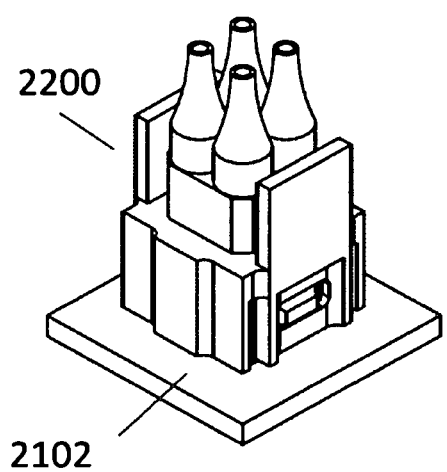
Fig. 18
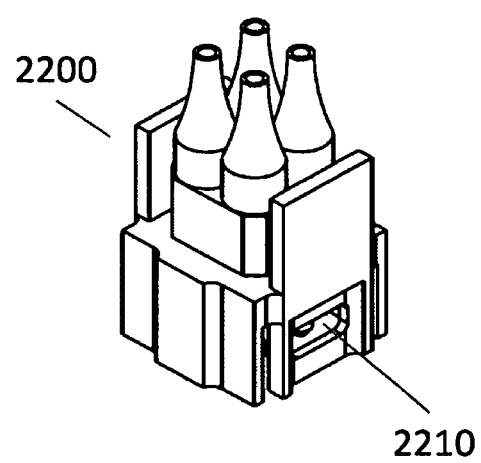
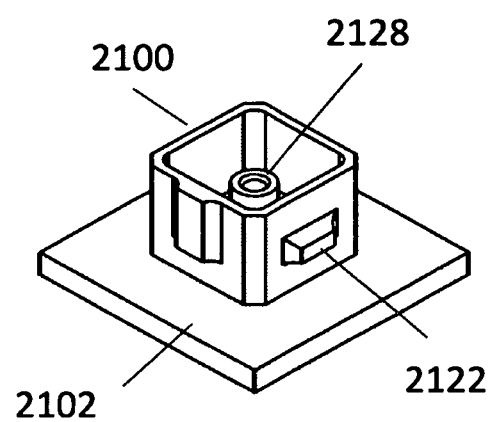
Fig. 19

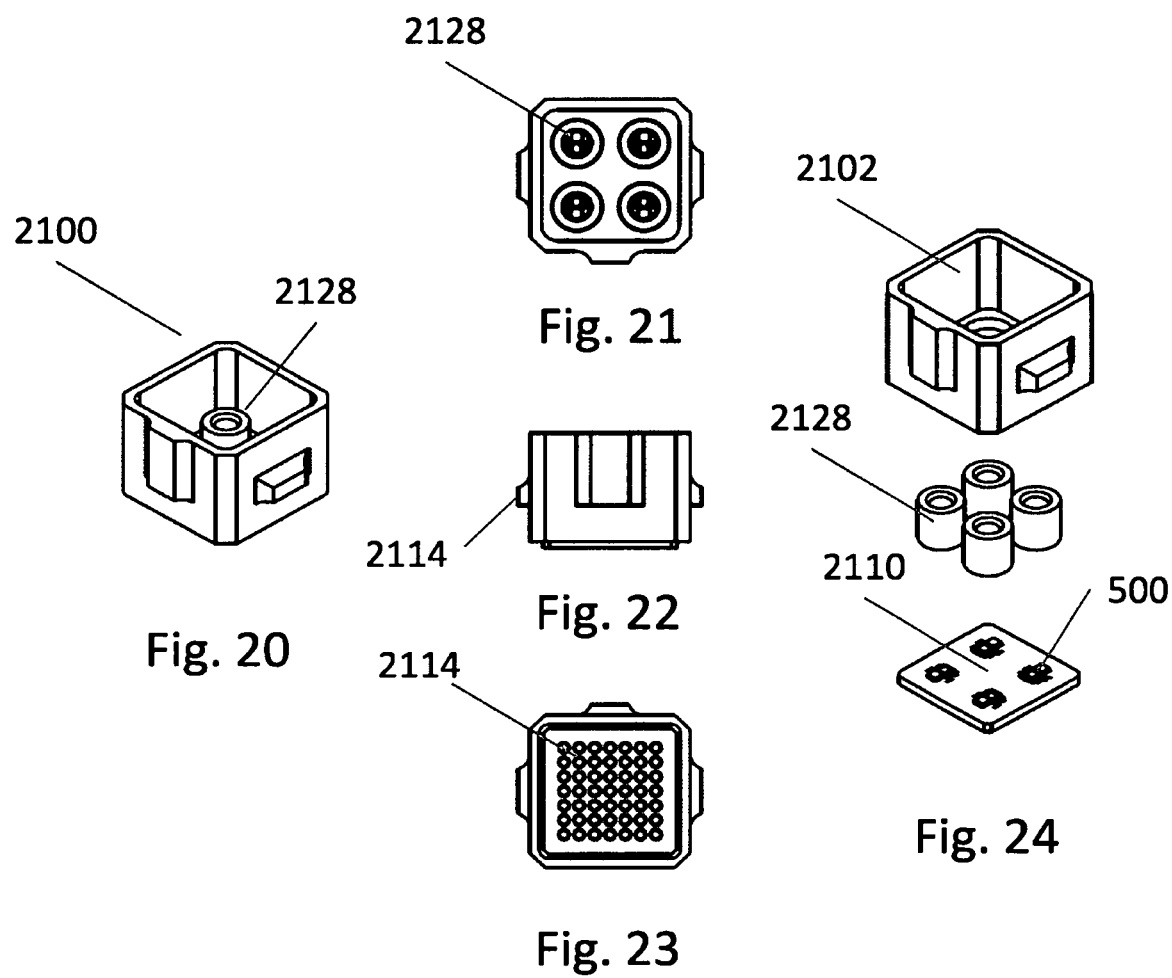

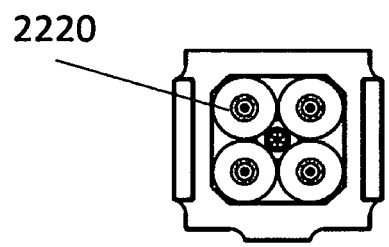
Fig. 26
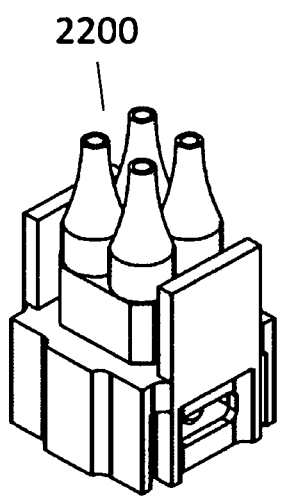
Fig. 25
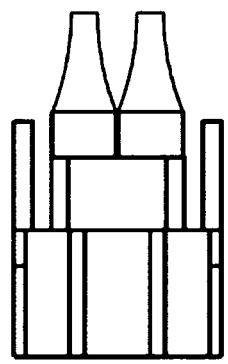
Fig. 27
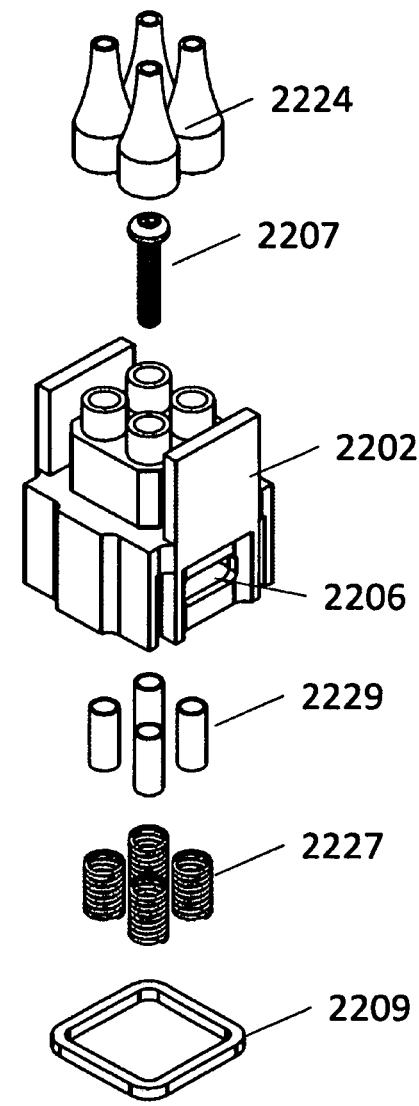
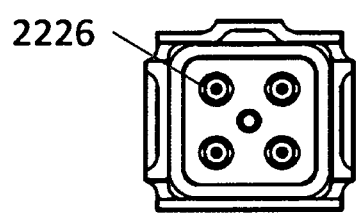
Fig. 28
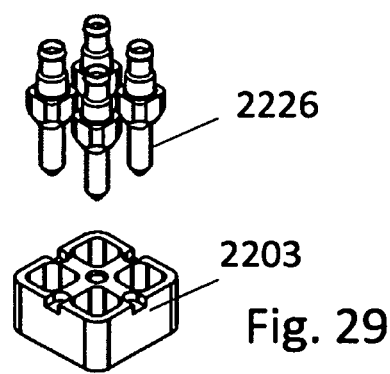
Fig. 29

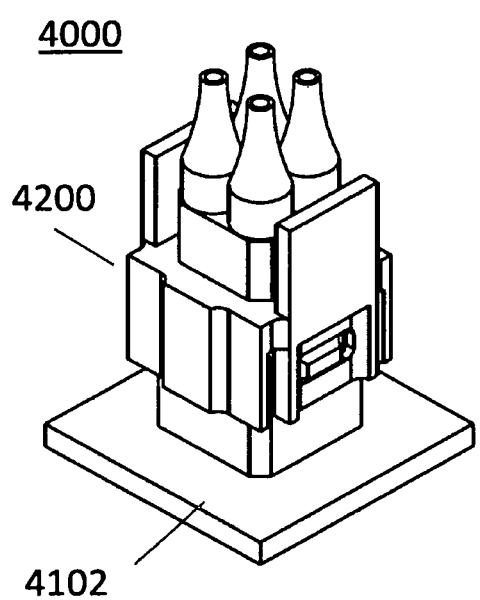
Fig. 33
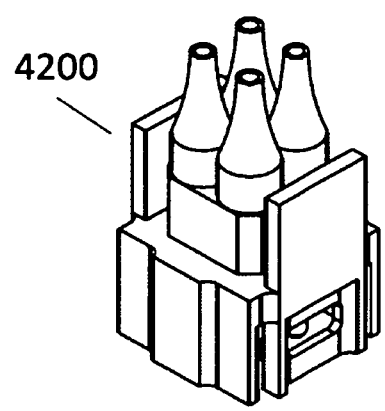
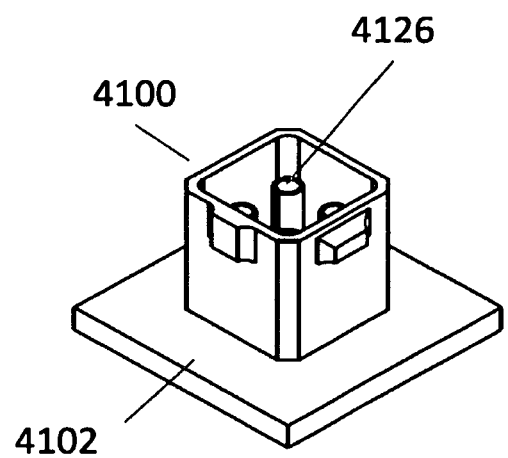
Fig. 34

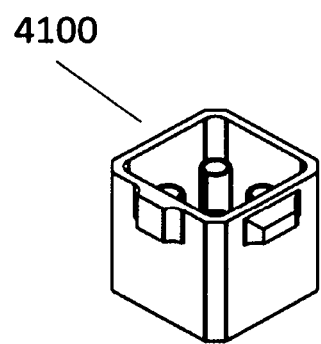
Fig. 35
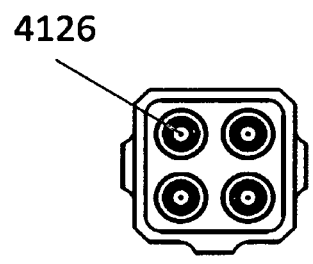
Fig. 36
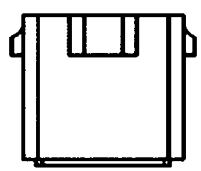
Fig. 37
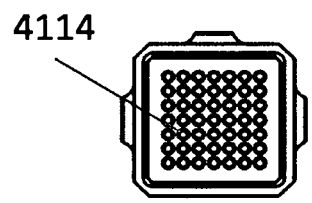
Fig. 38
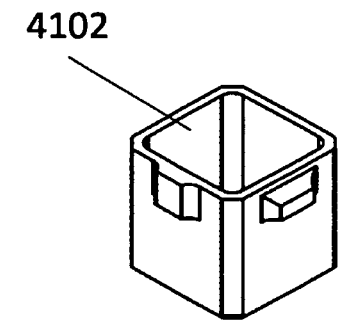
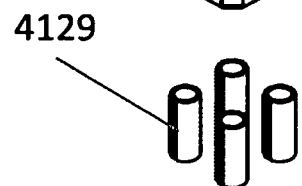
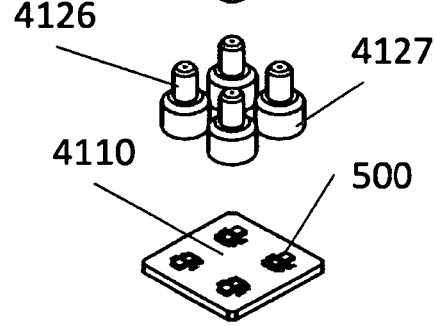
Fig. 39

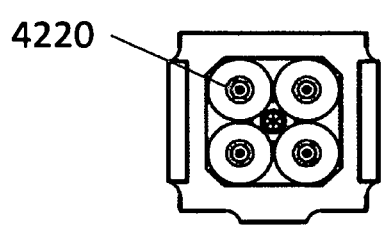
Fig. 41
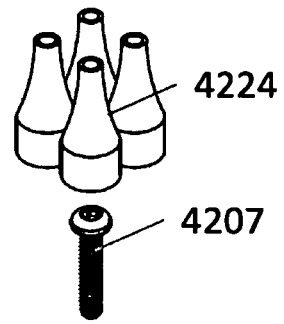
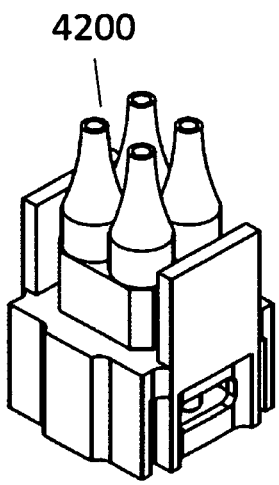
Fig. 40
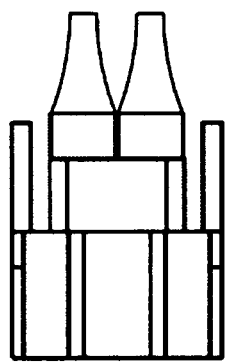
Fig. 42
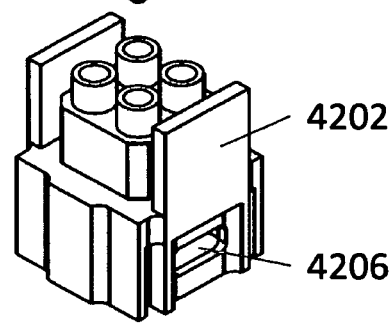
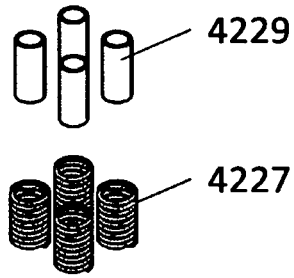
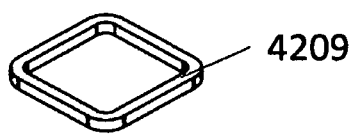
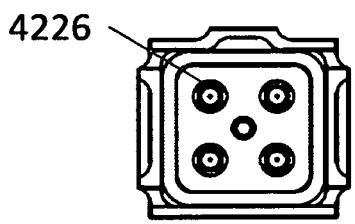
Fig. 43
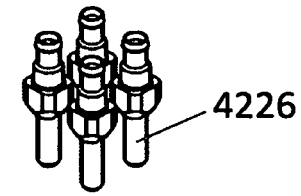
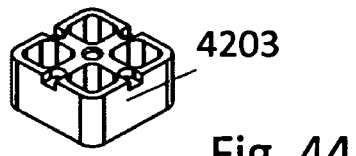
Fig. 44

SURFACE MOUNT PACKAGING FOR SINGLE MODE ELECTRO-OPTICAL MODULE

CROSS-REFERENCE TO RELATED APPLICATIONS

This application claims priority from U.S. provisional patent application No. 62/625,291 filed Feb. 1, 2018 entitled "Surface Mount Packaging for Single Mode Electro-Optical Module", which is incorporated herein by reference in its entirety.

TECHNICAL FIELD

The present invention relates to packaging and interconnection of electro-optical devices comprising optical transmitters and receivers, such as single mode fiber based optical transmitters and receivers for data center applications.

BACKGROUND

High performance optical devices have conventionally been packaged in either pluggable packages that insert into the faceplate of the circuit boards of data switching equipment or in large modules that mount directly on circuit boards for long haul/high performance applications.

In earlier times, data center interconnect was predominantly copper based. Interconnect speeds up to 1 GB/s were easily and cheaply implemented in small silicon chips that were surface mounted directly onto a printed circuit board (PCB). The electrical connectors for the links were typically mounted on the faceplate in high-density arrangements. With the right copper cables, distances of up to 100 meters were easily achieved. Fiber interfaces were used for distances longer than 100 meters, or where higher speeds were required. These fiber interfaces were a relatively small percentage of all interfaces in the data center and tended to be diverse in their specific implementations, depending on parameters such as the required speed and link distances. One solution was to define standard pluggable packages that could support a diverse array of different fiber standards, e.g. single mode fiber and multimode fiber. That way, each specific application could be optimized by simply picking the appropriate pluggable module and inserting it into the equipment.

As data center traffic grew even more, the need for 10 Gb/s copper links became apparent. Unfortunately, the 10G copper standard took several years to achieve the required performance and power consumption specifications, and even then, was only able to achieve a limited reach of about 50 meters, at a time when data centers were becoming not only faster, but often larger. Since the maximum distance of reach of the new generation of 10G copper interconnect was shorter than slower copper links, when many data centers were becoming much larger, it became clear that as speeds grew along with the size of the large data centers, only shorter links could be copper based, and the links beyond 50 meters would have to be fiber.

As data centers continue to grow in both size and speed of interconnect, fiber will take on a dominant role of interconnecting equipment, with copper being used only for very short links. Eventually, short links may also be completely replaced by fiber.

Although the roles of copper and fiber interconnect are reversing, system implementations have not yet changed significantly. In the days of dominant copper interconnect, the link ends for the copper links were small electronic chips that were directly soldered to the PCBs. Optical links, were, with relatively few exceptions, implemented in pluggable packages that plugged into the faceplates of the system boards. The result was that the copper interfaces could be much denser, i.e. as measured in links per board, because the electronic chips were small and distributed on the PCB while the connectors were also small and could be implemented in very dense arrays on the PCB faceplate. Optical modules were much bigger and required much more faceplate area per link than the copper links.

Going forward, there is a need for implementing optical ports with the same densities as, or higher densities than, copper links on the PCB faceplates. However, there are a number of challenges with existing pluggable modules. For example, the core switching capacity of silicon chips on these boards is much higher than the faceplate capacity of even the densest and fastest available pluggable optical modules. Pluggable modules can only dissipate heat along a very narrow area of the faceplate into which they are plugged. This presents a challenge with respect to power consumption figures for pluggable modules, particularly as the demand for speed continues to increase. Also, the speeds of optical links grow to 25 Gb/s and 56 Gb/s per lane, the design of connections between the core switching chips on the board and the pluggable optical modules on the faceplate becomes electrically more challenging, due to the interconnect lengths and speeds. Thus, improved or alternative solutions are needed for implementing high density optical ports for applications such as high-speed data center interconnect.

SUMMARY OF INVENTION

The present invention seeks to mitigate one or more of the above-mentioned disadvantages of known pluggable optical modules, or at least provide an alternative.

Aspects of the invention provide an electro-optical module, an optical fiber connector, and an assembly of a surface mounted electro-optical module and a detachable optical fiber connector. Embodiments of the invention provide modules configured for packaging of electro-optical devices, such as optical transmitters and receivers for high-speed, high density fiber interconnections, including data center interconnect applications.

A first aspect of the invention provides an electro-optical module comprising: a surface mount package body comprising a substrate and a cap; an array of semiconductor chips comprising photonic integrated circuits mounted on the substrate, each photonic integrated circuit comprising a photonic device and associated electronic circuitry, each photonic device comprising at least one of an optical emitter having an optical output aperture and an optical receiver having an optical input aperture; and the cap comprising an array of optical ports aligned to said optical input/output apertures of each photonic device, the array of optical ports being configured for connection to a corresponding array of optical ports of a fiber optic connector carrying a plurality of optical fiber pigtails.

For example, the array of optical ports of the cap of the package comprises an array of ferrule sockets for receiving connector ferrules of an optical fiber connector carrying a plurality of optical fiber pigtails. Alternatively, the array of optical ports of the cap may comprise an array of fiber stub ferrules, for coupling, e.g. using split sleeves, to optical fiber ferrules of the optical fiber connector carrying the plurality of optical fiber pigtails.

In an embodiment, the surface mount package has the form of a Ball Grid Array (BGA) package, in which electrical connections for the electronic circuitry extend from the electronic circuitry through the substrate to a back side of the substrate, and an array of a plurality of solder ball connections is provided on a back side of the substrate for attachment of the package body to a mounting surface and electrical connections thereto. In one embodiment, the BGA package comprises a ceramic BGA (CBGA) package, wherein the substrate and cap of the package body comprise a ceramic material. Optical fiber ferrules and ferrule sockets also comprise a ceramic material which can be precision molded or machined.

A second aspect of the invention provides a detachable fiber optic connector for the electro-optic module, the fiber optic connector comprising a connector body carrying a plurality of fiber optic pigtails and individual optical fiber connectors comprising a ferrule for each fiber, the ferrules being arranged as an array matching the array of optical ports of the electro-optical module, for optical coupling of the ferrules of each optical fiber with corresponding optical ports of the electro-optical module.

Another aspect of the invention provides an electro-optical assembly comprising:
an electro-optical module and detachable fiber optic connector carrying a plurality of fiber optic pigtails, the electro-optical module comprising a surface mount package body comprising a substrate and a cap; an array of semiconductor chips comprising photonic integrated circuits mounted on the substrate, each photonic integrated circuit comprising a photonic device and associated electronics, and each photonic device comprising at least one of an optical emitter having an optical output aperture and an optical receiver having an optical input aperture; and the cap comprising an array of optical ports aligned to said optical input/output apertures of each photonic device, e.g. wherein each optical port comprises a ferrule socket or a ferrule of an optical fiber stub;
the detachable fiber optic connector comprising a connector body carrying the fiber optic pigtails and connector ferrules of individual optical fibers arranged as an array matching the array of optical ports of the electro-optical module, connector ferrules of each optical fiber being removably inserted into corresponding ferrule sockets or split sleeves for connection to optical fiber stub ferrules of the electro-optical module.

For example, the electro-optical module comprises a ceramic ball grid array type package which, in use, is surface mounted to an underlying substrate, such as a PCB. The package is configured for mounting using standard assembly processes, such as pick-and-place and solder reflow. The detachable optical connector is not attached until after the electro-optical module has been surface mounted and the assembly is ready for use.

For example, in an embodiment, the electro-optical module comprises: a ceramic ball grid array package comprising a substrate and a cap, the substrate having a front surface and a back surface, an array of a plurality of semiconductor chips comprising optical devices and associated electronic circuitry being mounted over a device area of the front surface of the substrate, each of said optical devices comprising at least one of a light emitting device having an optical output aperture and a light receiving device having an optical input aperture; the back surface of the substrate comprising a ball grid array of a plurality of solder ball connections; a plurality of electrically conductive interconnections extending through the substrate and interconnecting the conductive tracks of the electronic circuitry of the semiconductor chips to corresponding ball connections of the ball grid array; the cap extending over and covering the substrate, attached around a periphery of the substrate and a surface of the cap comprising an array of a plurality of optical ports having an arrangement aligned to optical input/output apertures of the array of optical devices; each optical port of the array of optical ports being configured to receive a ferrule of an optical fiber connector for a single mode optical fiber.

When the array of optical devices comprises a n×m array of optical devices arranged over the substrate, the array of the plurality of optical ports comprises a corresponding arrangement of a n×m array of optical ports extending through a top surface of the cap and aligned to optical input/output apertures of the underlying optical transmitters and receivers. For example, wherein the n×m array of optical devices comprises a 2×2 array of optical devices, the optical ports are arranged as a corresponding 2×2 array to provide a vertically coupled or surface coupled arrangement. In an edge coupled or laterally coupled arrangement, the array of optical devices comprises an array of n optical devices over the substrate and the array of the plurality of optical ports comprises a 1×n array of optical ports arranged along an edge of the cap, the optical input/output apertures of the array of n optical devices being aligned to the array of the plurality of optical ports.

In an assembly of an electro-optical module and a detachable optical connector carrying a plurality of optical pigtails, wherein the electro-optical module is surface mounted on a printed circuit board, e.g. by solder reflow, wherein the detachable optical connector comprises a connector body carrying the plurality of optical fiber pigtails, wherein each optical fiber has an optical fiber connector comprising a connector ferrule, and the connector ferrules are configured as an array to removably plug into corresponding optical ports of the electro-optical module, the electro-optical module and detachable optical connector comprise alignment and latch means for securing together the electro-optical module and detachable optical connector, with optical fibers of the pigtails optically aligned to the optical input/output apertures of the optical devices of the electro-optical module.

For example, the alignment and latch means comprise alignment surfaces of the electro-optical module and of the detachable connector for x-y-z positioning of each optical fiber and the corresponding optical input/output aperture of one of the optical devices for effective optical coupling, and latch elements for removably attaching the optical fiber connector to the electro-optical module. In one embodiment, the alignment means comprise spacers and resiliently flexible elements, such as spring elements, for x-y-z positioning of the optical fiber relative to the optical input/output aperture of the optical device. Surfaces of the electro-optical module and the optical fiber connector may act as alignment elements for aligning each optical fiber to the corresponding optical input/output aperture the photonic device, and co-operate with latch elements for securing together the electro-optical module and the detachable optical fiber connector in alignment for effective optical coupling. In one embodiment, spacers are provided adjacent each chip to engage ferrules of the optical fiber connectors and ensure correct vertical spacing (z direction) between each optical fiber and the optical aperture of the photonic device for effective optical coupling.

Each photonic integrated circuit may comprise at least one of an optical receiver such as a photodiode detector, an optical emitter such as a diode laser, or an optical transceiver comprising an optical emitter and an optical detector; the optical devices may include other optical components such as a modulator, an optical amplifier, and optical waveguides in combination with an optical receiver or an optical emitter, together with associated electronic circuitry. The electro-optical module may be configured for surface coupling, i.e. vertical coupling, or for edge coupling, of the optical connector carrying the fiber optic pigtails. In either a vertically coupled or edge coupled configuration, the electro-optical module and the optical connector comprise latch elements for securing together the electro-optical module and the optical connector. Alignment means, such as corresponding alignment surfaces of the electro-optical module and the optical fiber connector, provide for x, y, z alignment and spacing so that the optical fibers of the pigtails are optically aligned to optical apertures of respective light receiving and light emitting devices of the electro-optical module.

Also disclosed is a method of fabrication and assembly of the electro-optical module. For example, in an embodiment of the method of fabrication, the electro-optical module is surface mounted to the printed circuit board by conventional pick-and-place and solder reflow processes. Thus, other aspects of the invention provide a plurality of electro-optical modules as defined above, configured for surface mounting using tape and reel format, and methods for fabrication of the disclosed components and their assembly.

Electro-optical modules of embodiments described herein enable optical ports to be implemented with higher density, and potentially with densities comparable to, or greater than, densities of copper links on the PCB faceplates. This packaging configuration also enables distribution of the Electro-Optical (E/O) modules on the PCB close to, i.e. in physical proximity to, the internal switching chips on the PCB, in a manner analogous to the copper links of earlier times. When the E/O module is mounted adjacent to the core switch chip that it is communicating with, the communication link is much shorter and easier to implement in a way that the signal is clean and error free, and consumes less power. By distributing the optical modules over the board, they can be more effectively cooled by spreading the heat dissipation across the entire area of the board and picking up airflow across the PCB.

Moreover, implementing the electro-optical modules in a package form factor that is similar to conventional surface mountable ball grid array packages allows them to be shipped in tape and reel format, so that the printed circuit board can be assembled in the same way as if there were only electronics on the board, e.g. using surface mount, pick-and-place machines, followed by solder reflow ovens. The optical packages are configured to withstand the heat of the reflow ovens, so that expensive high-speed electrical sockets are not required for the optical modules, because direct surface mount soldering is possible and standard re-work methods and tools can be used to rework defects on the board including the optical modules. This approach also improves signal integrity of the links on the PCB, e.g. to enable 25G or higher speed links. Since surface mounting of the CBGA package is accomplished with the optical fiber connectors detached, the optical fiber connectors can be fabricated from materials and components that do not need to be able to withstand high temperature PCB processing, such as solder reflow.

The foregoing and other objects, features, aspects and advantages of the present invention will become more apparent from the following detailed description, taken in conjunction with the accompanying drawings, of embodiments of the invention, which description is by way of example only.

BRIEF DESCRIPTION OF THE DRAWINGS

In the drawings, identical or corresponding elements in the different Figures have the same reference numeral, or corresponding elements have reference numerals incremented by 1000 in successive Figures.

FIG. 5 shows a schematic top view of the electro-optical module of FIG. 3;

FIG. 6 shows a schematic underside view of the electro-optical module of FIG. 3;

FIG. 7 shows a schematic side view of the electro-optical module of FIG. 3;

FIG. 18 shows a schematic isometric view of an assembly comprising an electro-optical module of a third embodiment, mounted on a printed circuit board, with a detachable optical connector comprising four optical fiber pigtails;

FIG. 19 shows a schematic isometric view of components of the assembly comprising the electro-optical module shown in FIG. 18;

FIG. 20 shows a schematic isometric view of the electro-optical module shown in FIG. 19;

FIG. 21 shows a schematic top view of the electro-optical module of FIG. 20;

FIG. 22 shows a schematic side view of the electro-optical module of FIG. 20;

FIG. 23 shows a schematic underside view of the electro-optical module of FIG. 20;

FIG. 24 shows a schematic exploded isometric view of components of the electro-optical module of FIG. 20;

FIG. 25 shows a schematic isometric view of the male optical connector of the third embodiment, with a plurality of optical fibers and optical fiber connectors inserted into the body of the connector;

FIG. 26 shows a schematic top plan view of the optical connector of FIG. 25;

FIG. 27 shows a schematic side view of the optical connector of FIG. 25, with optical fibers and optical fiber connectors inserted;

FIG. 28 shows a schematic underside plan view of the optical connector of FIG. 25;

FIG. 29 shows a schematic isometric exploded view of components of the male optical connector and the optical fibers shown in FIG. 25;

FIG. 33 shows a schematic isometric view of an assembly comprising an electro-optical module of a fifth embodiment, mounted on a printed circuit board, with a detachable optical connector comprising four optical fiber pigtails;

FIG. 34 shows a schematic isometric view of components of the assembly comprising the electro-optical module shown in FIG. 33;

FIG. 35 shows a schematic isometric view of the electro-optical module shown in FIG. 34;

FIG. 36 shows a schematic top view of the electro-optical module of FIG. 35;

FIG. 37 shows a schematic side view of the electro-optical module of FIG. 35;

FIG. 38 shows a schematic underside view of the electro-optical module of FIG. 35;

FIG. 39 shows a schematic exploded isometric view of components of the electro-optical module of FIG. 35;

FIG. 40 shows a schematic isometric view of the male optical connector of the fifth embodiment, with a plurality of optical fibers and optical fiber connectors inserted into the body of the connector;

FIG. 41 shows a schematic top plan view of the optical connector of FIG. 40;

FIG. 42 shows a schematic side view of the optical connector of FIG. 40;

FIG. 43 shows a schematic underside plan view of the optical connector of FIG. 40;

FIG. 44 shows a schematic isometric exploded view of components of the male optical connector and the optical fibers shown in FIG. 40;

DESCRIPTION OF EMBODIMENTS

Figure 1:
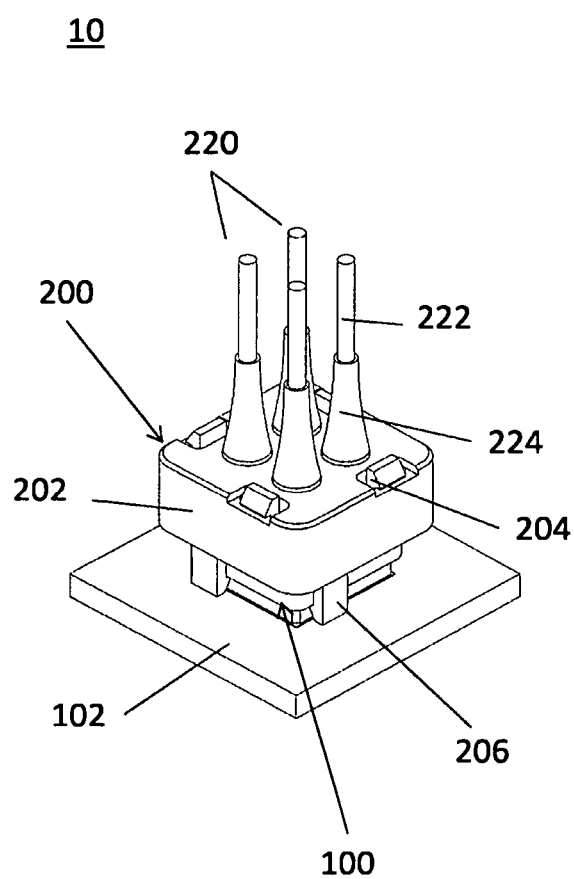
FIG. 1 shows a schematic isometric view of an assembly comprising an electro-optical module of a first embodiment, mounted on a printed circuit board, with a detachable optical connector comprising four optical fiber pigtails.

An isometric schematic view of an assembly 10 comprising an electro-optical module 100 of a first embodiment of the invention, surface mounted on a substrate comprising a printed circuit board (PCB) 102, is shown in FIG. 1. An optical connector 200 having a connector body 202 carrying a plurality of four single mode optical fiber pigtails 220, with strain relief boots 224, is shown plugged into the electro-optical module 100. Latch means comprising latch elements 204 and 206 secure the optical fiber connector 200 to the electro-optical module 100.

Figure 2:
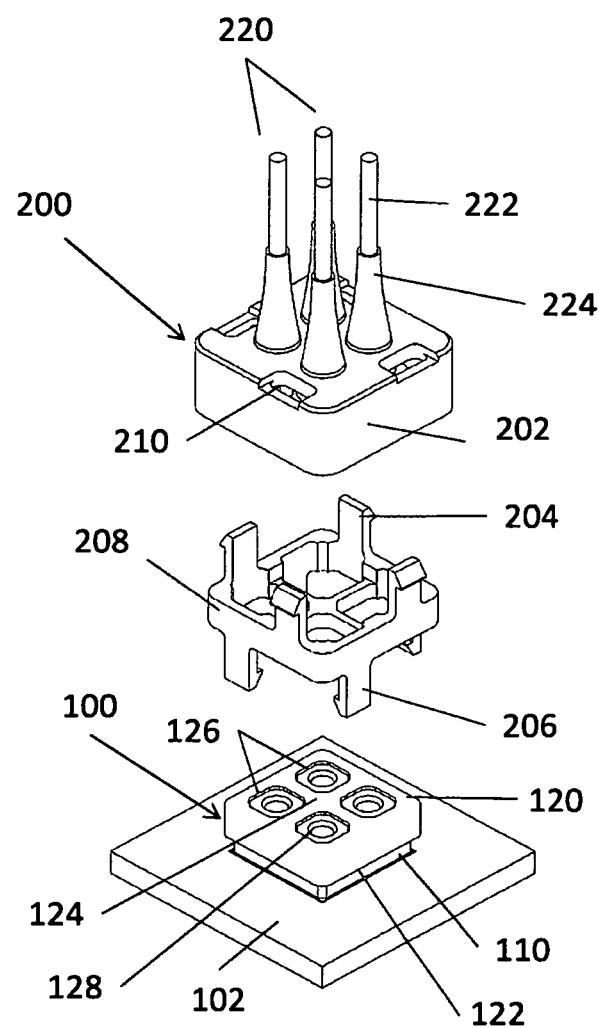
FIG. 2 shows a schematic exploded isometric view of components of the assembly comprising the electro-optical module shown in FIG. 1.

FIG. 2 shows an exploded isometric view of the components of the assembly 10 comprising the electro-optical module 100 and the optical connector 200 shown in FIG. 1. The electro-optical module 100 has the form of a ceramic package, comprising a ceramic substrate 110 and a ceramic cap 120, which contains an array of a plurality of electro-optical integrated circuit devices (e.g. see FIG. 4, electro-optical integrated circuit devices 130). On the front surface 124 of the cap 120, there is an array of four optical ports 126 with ceramic sockets 128, The array of ports is arranged for receiving four male optical fiber connectors carried by the optical connector 200. The back surface of the substrate 110 of the module 100 is surface mounted and directly attached to the PCB 102, e.g. by soldering. Latch means are provided to secure the optical connector 200 to the electro-optical module 100. For example, as illustrated, latch elements 204 and 206 are carried by a separate latch plate 208 which is interposed between the electro-optical module 100 and the connector 200. Latch arms 204 extend towards the connector 200 and are arranged to engage corresponding latch openings 210 in the connector body 202. The latch arms 206 extend in the opposite direction and are arranged to engage surfaces 122 around the edges of the cap 120 of the electro-optical module 100, thereby detachably securing the connector 200, carrying the optical fiber pigtails, to the electro-optical module 100, as illustrated in FIG. 1.

Figure 3:
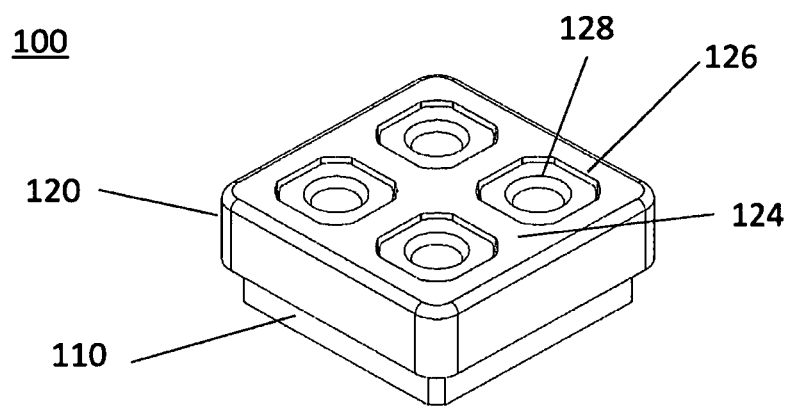
FIG. 3 shows a schematic enlarged isometric view of the electro-optical module of the first embodiment shown in FIG. 2.

FIG. 3 shows an enlarged isometric view of electro-optical module 100 of the first embodiment, comprising the ceramic substrate 110, ceramic cap 120, with the array of four optical ports 126 comprising ceramic sockets 128 on the front surface 124 of the cap 120.

Figure 4:
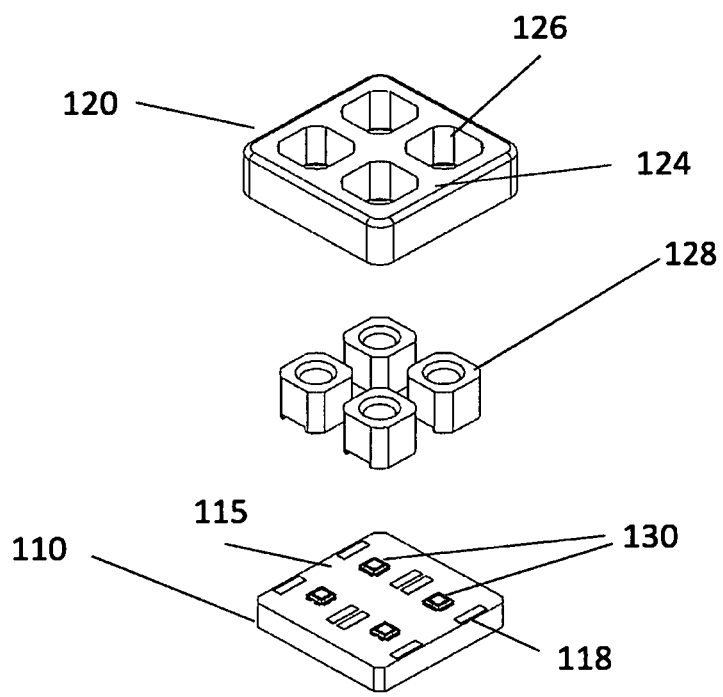
FIG. 4 shows a schematic exploded isometric view of components of the electro-optical module of FIG. 3.

FIG. 4 shows an exploded isometric view of components of the electro-optical module shown in FIG. 3. The ceramic substrate 110 of the package module 100 comprises an array of four electro-optical devices 130, e.g. semiconductor chips comprising integrated electrical and optical components, such as optical transmitters and optical receivers, modulators and associated electronic control circuitry. These electro-optical devices may be implemented, for example, as monolithic indium phosphide (InP) electro-photonic chips, or silicon photonic chips, or a combination thereof. The electro-optical chips 130 are arranged as a regular array, distributed over the area of top surface 115 of the ceramic substrate 110. Four ceramic sockets 128 are aligned to the electro-optical chips 130 and secured to the substrate 110, for example by soldering to solder pads 118, using gold-tin eutectic solder. After the sockets are soldered, the ceramic cap 120 is placed over the underlying assembly, with the ports 126 aligned to receive the sockets 128. For example, the cap 120 is attached to the substrate 110 using gold-tin eutectic solder. Alternatively, the cap may be attached using a high-temperature adhesive, i.e. of a type which will withstand subsequent reflow soldering when the module 100 is soldered to the PCB 102.

FIG. 5 shows a plan view of the front surface 124 of the cap 120 showing the electro-optical devices 130 aligned within the optical ports 126. If the optical aperture defining the light emitting surface area of a light emitter, or the optical aperture defining the light receiving surface area of a light receiving device, is not centred on the electro-optical chip, each chip is positioned accordingly on the substrate, i.e. so that the optical aperture of each light emitter or light detector is centred within one of the optical ports 126 of the cap 120, when the package is assembled. FIG. 6 shows a plan view of the back surface 112 of the electro-optical module 100, which comprises a ball grid array (BGA) of solder balls 114. FIG. 7 shows a side view of the electro-optical module 100 showing the ceramic substrate 110, ceramic cap 120 and solder balls 114. Thus, from the underside, the electro-optical module 100 has the form factor of a ceramic ball grid array package (CBGA), and on the front side, comprises a closely spaced array of four optical ports 126.

The CBGA electro-optical module provides for surface mounting by direct attachment to the underlying PCB, e.g. using a conventional solder reflow process to attach the module and make electrical connections to conductive tracks of the PCB, for interconnection to signal processing electronics carried by the PCB. During assembly, the module 100 is attached to the PCB 102 independently of the optical connector 200 carrying the fiber pigtails. After the electro-optical module 100 is attached to the PCB, the optical fibre connector 200 is then inserted and latched to connect the optical fiber pigtails. That is, the optical fiber pigtails are vertically coupled to the electro-optical module. For high density interconnects, it will be appreciated that a plurality of electro-optical modules 100 may be mounted on the PCB. The modules may be distributed over the area of the PCB to facilitate thermal dissipation.

During shipping and PCB assembly, the optical ports in the cap 120 of the electro-optical module 100 are temporarily covered to protect the underlying electro-optical components within the package. For example, the ports are covered with a protective tape, e.g. a polyimide tape which is capable of withstanding pick and place and reflow processes during PCB assembly. This tape is then removed when the male connector 200 carrying the optical fiber pigtails is to be inserted into the ports of the electro-optical module.

Figure 8:
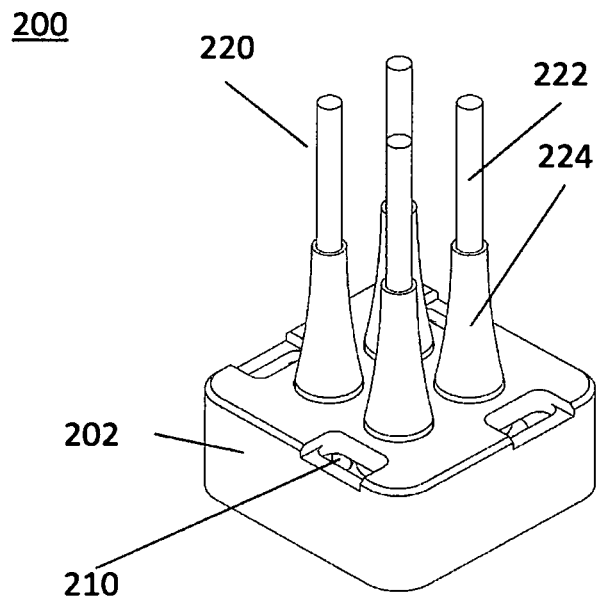
FIG. 8 shows a schematic isometric view of the male optical connector of the first embodiment, with a plurality of optical fibers and optical fiber connectors inserted into the body of the connector.
Figure 9:
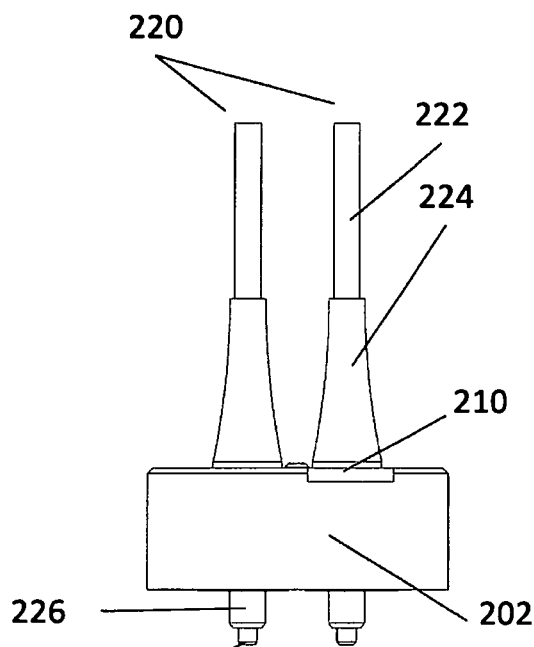
FIG. 9 shows a schematic side view of the optical connector of FIG. 8, with optical fibers and optical fiber connectors inserted.
Figure 10:
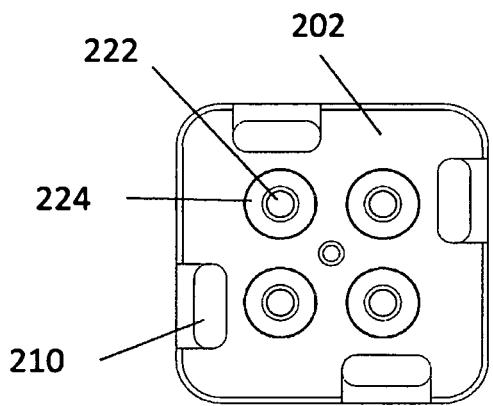
FIG. 10 shows a schematic top plan view of the optical connector of FIG. 8.
Figure 11:
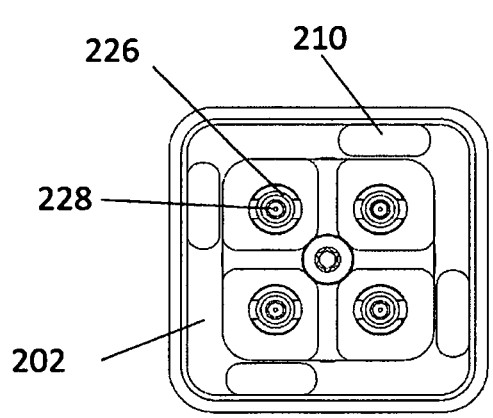
FIG. 11 shows a schematic underside plan view of the optical connector of FIG. 8.

The male optical connector 200 will now be described in more detail with reference to FIGS. 8 to 12. In this embodiment, the connector is implemented in a way very similar to conventional optical connectors, e.g. using ceramic ferrules and conventional strain reliefs. Because the male connector 200 and the attached optical fibers are not in place on the PCB during reflow to attach the electro-optical module to the PCB, standard components, optical adhesives and assembly techniques can be used for assembly of the male optical connector 200. FIG. 8 shows an isometric schematic view of the body 202 of optical connector module 200 of the first embodiment, with the four optical fiber pigtails 220 inserted. Strain relief elements 224 extend from the connector body 202 around the external protective jacket 222 of the optical fibers. Latch openings 210 are provided for receiving the latch arms 204 of the interconnecting latch plate 208 shown in FIG. 2. FIG. 9 shows a side view of the connector body 202 with the male optical fiber connectors inserted. That is, each optical fiber pigtail 220 comprises an optical fiber 228 having a fiber connector comprising a ceramic ferrule 226 extending through the underside of the body 202, and the optical fibers each extend through the connector body 202 within an external jacket 222 and a strain relief boot 224. FIG. 10 shows a top plan view of the components of the connector 200 shown in FIG. 8, and FIG. 11 shows an underside view of the components shown in FIG. 8 and FIG. 9, showing the ferrules 226 and fibers 228 of four male optical fiber connectors inserted in the body 202 of the connector 200.

Figure 12:
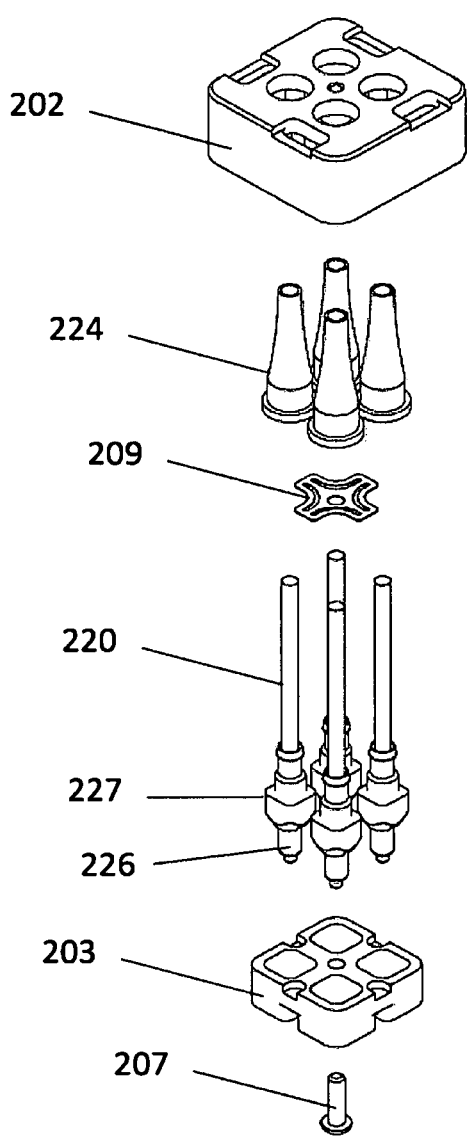
FIG. 12 shows a schematic isometric exploded view of components of the male optical connector and the optical fibers shown in FIG. 8.

FIG. 12 shows an isometric schematic exploded view of the components of connector 200 to show more details of the assembly, which comprises the outer connector body 202, and inner connector body 203, the strain relief boots 224, optical fiber pigtails 220 with male connectors comprising ceramic ferrules 226. The ferrules 226 of the fiber connectors are inserted into the inner connector body 203, with a leaf spring 209 positioned between the fiber connectors 227 for alignment of the four fiber connectors. The strain boots 224 are placed over the optical fiber pigtails 220 and inserted into the outer connector body 202. The inner connector body 203 is then fastened to the outer connector body 202, e.g. using a fastener 207, such as a screw, which extends through the plate of spring 209.

In use, the male connector 200 carrying the four optical fiber pigtails 220 is plugged into the CBGA electro-optical module 100 which is attached on the PCB, as illustrated in FIG. 1. Since the fiber pigtails are vertically coupled (surface coupled) through the optical connector 200 to the electro-optical module, when the male optical connector 200 is inserted and latched to the electro-optical module 100, due to the tight spaces available for routing and bending the optical pigtails, it is desirable that the optical pigtails are implemented using a fiber technology that is tolerant of a tight bend radius in the fiber. Highly flexible fibers with a tight bend radius of this type are now commercially available at reasonable cost.

During shipping and assembly, protective tape covering the optical ports of the electro-optical module is left in place until just before the connector 200 is inserted. The latch elements are configured so that the optical fiber connector is removable, i.e. detachable. Thus, if needed, the fiber connectors can easily be removed to allow for rework of the package or adjacent electronic components. This may be required if, for example, issues are discovered during manufacturing test.

Embodiments of the present invention provide an electro-optical module having the form factor of a Ceramic Ball Grid Array (CBGA) package capable of being surface mounted on printed circuit boards using standard electronics pick and place and reflow manufacturing technology. This packaging allows ultra-high-speed single mode fiber based optical transmit and receive devices to be mounted directly on Printed Circuit Boards (PCBs) in close proximity to their associated electronics. This provides significantly shorter electrical interconnects, e.g. lengths of mm vs. cm, which reduces losses and distortion of the high frequency electrical signals enabling lower power signals and lower error rates on the interfaces. The shorter electrical interconnects may also allow for simpler clock and data recovery circuits or, in some cases, complete elimination of some of this circuitry.

This assembly comprising an electro-optical module in the form of a surface mountable package and a detachable fiber optic connector enables optical ports, for applications such as data center interconnect, to be implemented with higher density, and potentially with densities comparable to, or greater than densities of copper links on the PCB faceplates, This configuration also enables distribution of the electro-optical modules on the PCB close to the internal switching chips on the PCB, in a manner analogous to the copper links of earlier times. When the electro-optical module is mounted adjacent to the core switch chip that it communicates with, the electrical links are much shorter, facilitating link implementation, e.g. to assist in providing a signal that is clean and error free, and with lower power consumption. By distributing the optical modules over the board, they can be effectively cooled by spreading the heat dissipation across the entire area of the board and picking up airflow across the PCB.

Implementing the optical modules in a package form factor that is similar to electronic surface mountable ball grid array packages allows them to be shipped in tape and reel format, so that the printed circuit board can be assembled in the same way as if there were only electronics on the board, e.g. using surface mount, pick-and-place machines followed by solder reflow ovens. The materials selected for the electro-optical modules are selected to withstand the heat of the reflow oven, so that direct surface mount soldering is possible and standard re-work methods and tools can be used to rework defects on the board including the optical modules. For these reasons, fabrication of the module using materials similar to conventional surface mounted ceramic ball grid array (CBGA) packages is desirable. This eliminates the need for optical modules which require expensive high-speed electrical sockets. Direct electrical connections using surface mounting of the CBGA type electro-optical module assists with improved signal integrity for high-speed links, e.g. 25G links, on the PCB. Appropriate selection of ceramic packaging materials, e.g. a package substrate having good thermal conductivity, also assists with thermal dissipation.

Providing that the chips implementing the optical links in the package are reliable, capable of operating over long distances at low BER, and are low-cost, the need for multiple specialized fiber standards to optimize for cost/performance will be reduced or eliminated. Thus, a single link implementation could potentially serve almost all requirements in the data center. Surface mounting by soldering the electro-optical packages on the PCB becomes feasible, in a way analogous to the old copper Ethernet links. For example, a single link standard for inside a data center could be chosen if performance is high and cost is low.

Since the electro-optic chips are mounted within a surface mountable CBGA package, and optical connections to the optical aperture of optical emitters or receivers are made with a detachable optical fiber connector carrying the optical fiber pigtails, precise optical alignment of the individual optical fibers, optical fiber sockets and optical apertures of the optical emitters or receivers is required. It is important that mating surfaces of the electro-optical module and the optical fiber connector provide appropriate physical and optical alignment of the optical components. In part, this is achieved by using packaging materials such as precision moldable or machinable ceramic parts, e.g. for the substrate, optical fiber ferrules, and the cap of the CBGA electro-optic package, so that the components can be manufactured with tight tolerances, i.e. sub-micron. Preferably, precision automated alignment, e.g. automated pick-and-place alignment for sub-micron placement, is used to provide x-y axis alignment of components for placement and attachment of the electro-optic chips to the package substrate. These techniques provide for accurate x-y axis lateral alignment of components, so that the optical aperture of the optical emitter or receiver is centered relative to the optical fiber. Another consideration is vertical optical alignment, i.e. in the z-direction, to ensure the components are spaced at an appropriate distance for effective optical coupling between the optical emitter or optical receiver and the optical fiber, e.g. taking into account optical beam divergence. In some embodiments, the z-direction alignment can be provided by precision molding or machining of the component parts, so that mating surfaces of the components, e.g. surfaces of each ceramic socket 128 of the electro-optic module and each ceramic ferrule 226 of the optical fiber connector, align and correctly position the face of the optical fiber relative to the optical aperture of the optical emitter or optical receiver. In assemblies of other embodiments, other arrangements of the latch and alignment means may be used.

Figure 13:
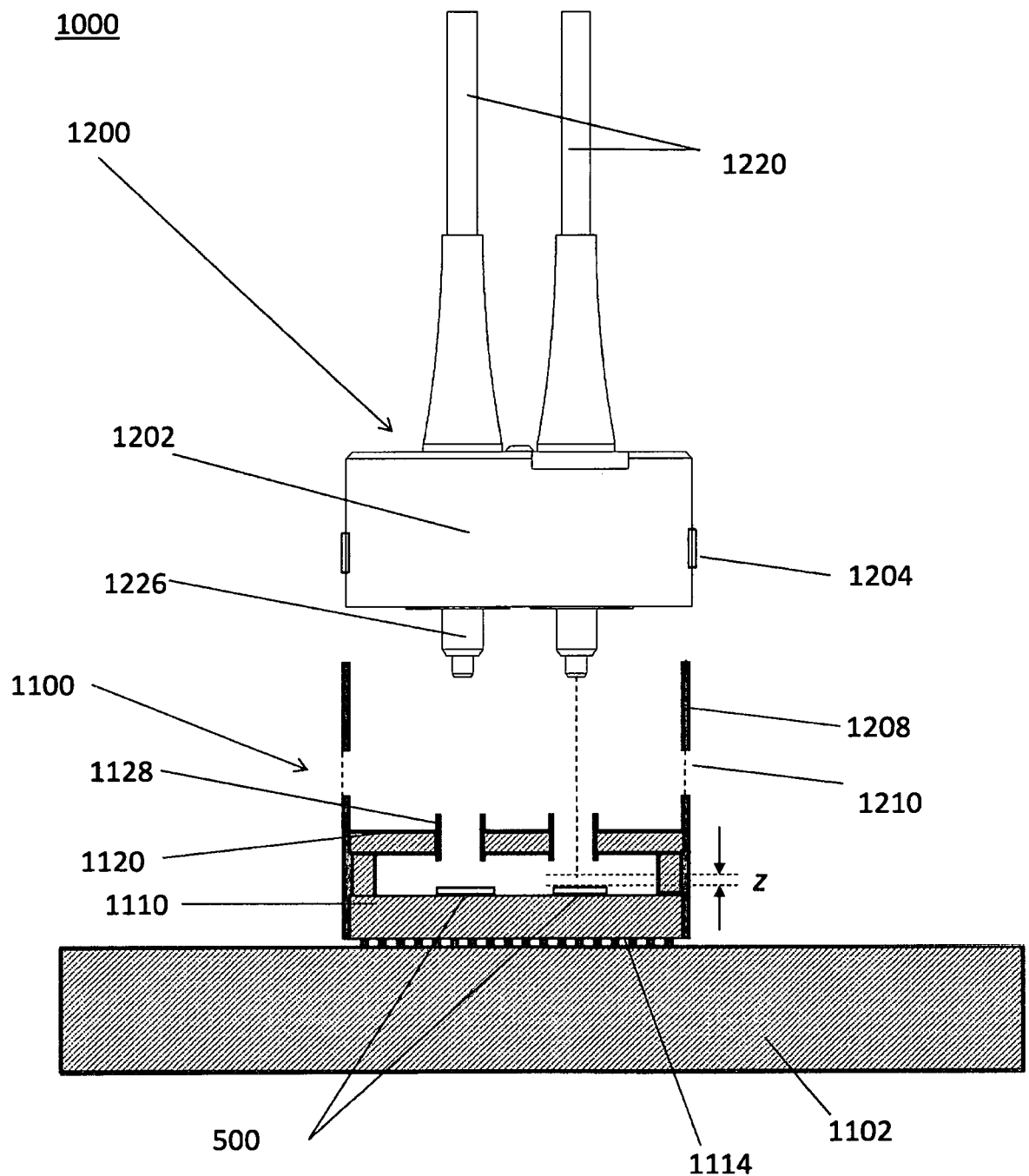
FIG. 13 shows a schematic lateral cross-sectional view of components of an assembly of an electro-optic module and a fiber optic connector of a second embodiment, during alignment and insertion of the fiber optic connector into the electro-optic module.

For example, an assembly 1000 of an electro-optic module 1100 and an optical fiber connector 1200 of a second embodiment will be described with reference to the simplified schematic diagrams shown in FIGS. 13 to 16. Many elements of this assembly correspond to those of the first embodiment and are indicated by the same reference numeral incremented by 1000. Thus, FIG. 13 shows a simplified cross-sectional view of parts of an assembly 1000 of the second embodiment comprising a fiber optic connector 1200 and an electro-optic module 1100 in the form of a CBGA package mounted on a circuit board 1102, wherein the connector 1200 is aligned ready for insertion into the electro-optic module 1100. The electro-optical module 1100 comprises a ceramic substrate 1110, a ceramic cap having an array of optical ports comprising sockets 1128 for receiving ferrules 1226 of the optical fibers carried by the optical fiber connector 1200, similar to the electro-optical module 100 of the first embodiment. The CBGA package is surface mounted on the underlying substrate, i.e. PCB 1102, attached by the solder ball grid array 1114. In this embodiment, instead of a separate latch plate interconnecting the electro-optic module and the optical fiber connector, the electro-optic module comprises a metal sleeve 1208 fitted around the ceramic components and extending upwardly to form a socket or receptacle for receiving the connector 1200, with latch openings 1122 for receiving latch elements 1204 of the optical fiber connector 1200. The metal sleeve around the ceramic components provides a receptacle that assists in alignment of the optical fiber connector 1200 during insertion into the electro-optical module 1100. As noted above for the first embodiment, the optical fiber ferrules 1226 and the optical fiber sockets 1128 are precision molded or machined ceramic components which provide for precise lateral alignment, i.e. fine alignment in the x-y direction, when the optical fiber ferrules are inserted into the sockets and centered over the optical aperture of the underlying photonic device. Automated pick-and-place systems can provide submicron alignment of components. As indicated in FIG. 13, the vertical alignment and spacing, i.e. in the z-direction, between the optical fiber and the optical aperture of the photonic device is also critical for effective optical coupling. While mating surfaces of the electro-optical module and the body and components of the optical fiber connector can be molded or machined with close tolerances, alignment should also to take into account other manufacturing variances, such as, the thickness of the semiconductor chips carrying the photonic integrated circuits. For example, these chips may typically be backside thinned, e.g. by chemical mechanical polishing, to a thickness of e.g. 125 µm±2 to 3 µm. Thus, it may be necessary to provide alignment components to accommodate a few microns of radial and vertical adjustment for optical alignment, as will be described below with reference to FIG. 16.

Figure 14:
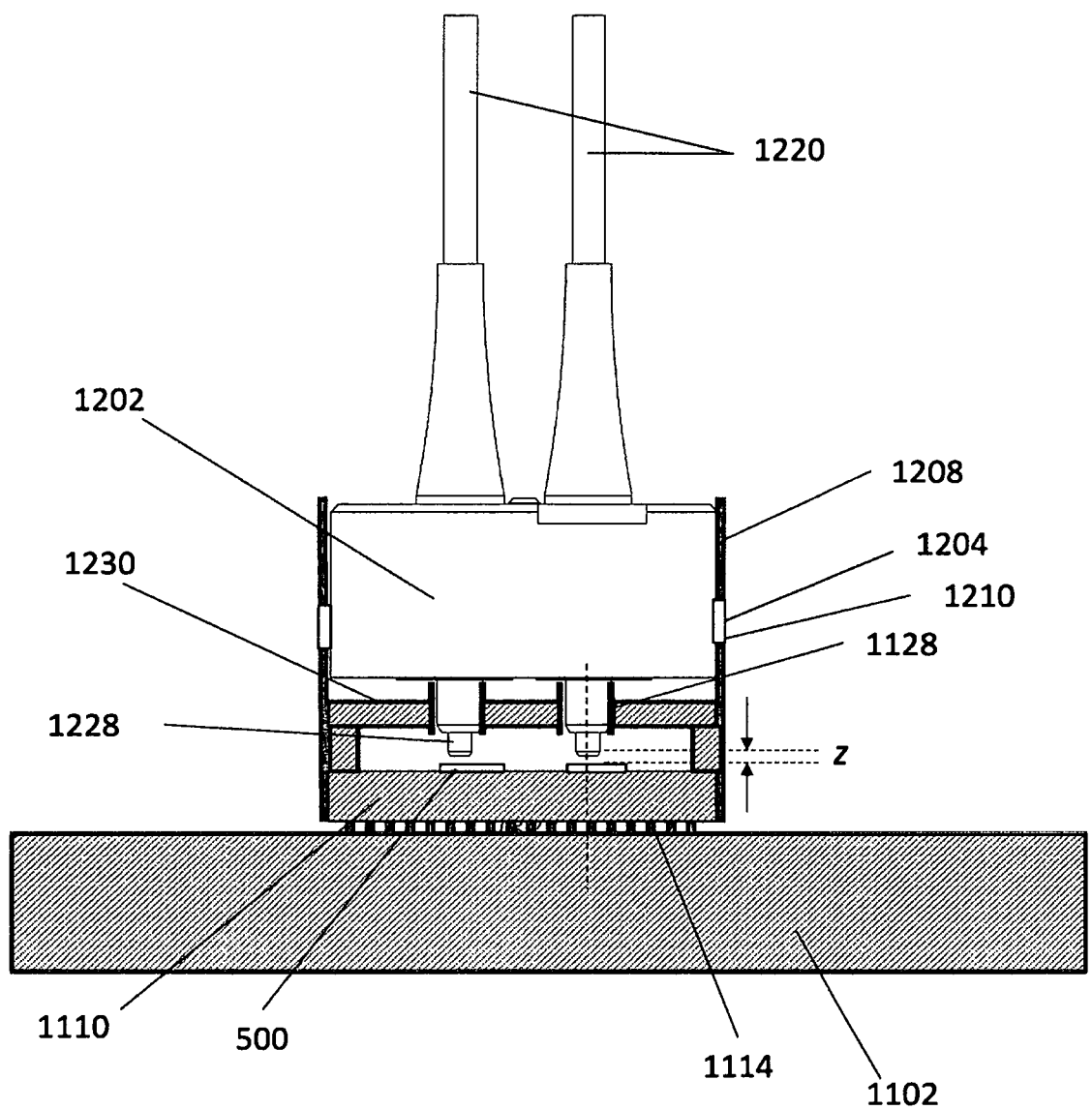
FIG. 14 shows a schematic lateral cross-sectional view of components of an assembly of an electro-optic module and a fiber optic connector of the second embodiment, after alignment and insertion of the fiber optic connector, with latches engaged to secure the components.

FIG. 14 shows a simplified cross-sectional view of parts of an assembly 1000 of the second embodiment comprising a fiber optic connector 1200 and an electro-optic module 1100 in the form of a CBGA package mounted on a circuit board 1102, wherein the connector 1200 is inserted into the electro-optic module 1100 and latched together with latches 1204 engaging latch apertures 1122 in the metal sleeve 1208. As illustrated schematically, the faces of the optical fibers are positioned a predetermined vertical distance z from the optical aperture of the photonic device for effective optical coupling. Numbering of other components of the assembly is the same as FIG. 13.

Depending on how the array of semiconductor devices are mounted on the substrate, the optical ports of the package are positioned to receive ferrules of the optical fibers with proper alignment in the lateral x-y direction and in the vertical z direction. This optical alignment will now be described in more detail.

Figure 15:
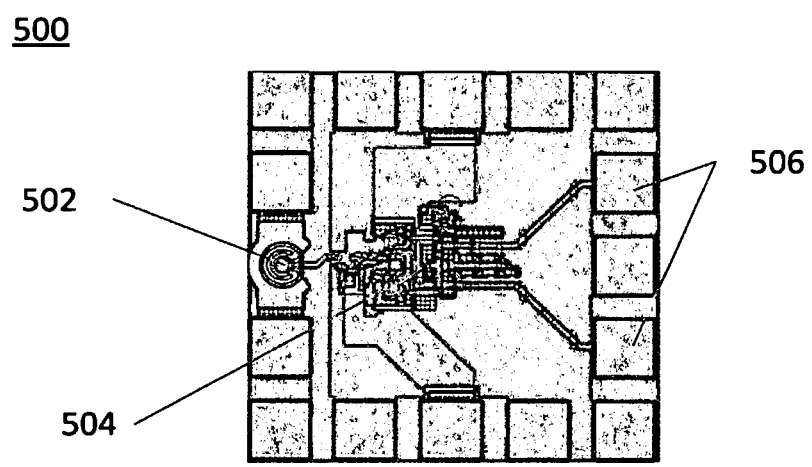
FIG. 15 shows a photomicrograph of a plan view of an example of a semiconductor chip comprising an integrated electro-photonic device, wherein the electro-photonic device comprises a photo-diode detector and associated electronic circuitry.

By way of example only, FIG. 15 shows a photomicrograph of an electro-chip 500 comprising a photodetector 502 and associate electronic circuitry 504 comprising a TIA amplifier with interconnect metallization to bond pads 506. In this particular chip, the photodetector and its optical aperture are near the periphery of the chip, while the electronic circuitry of the TIA amplifier occupies the central area of the chip. That is, the optical detector is not centered on the chip. Accordingly, in assembly of an electro-optical module containing an array of a plurality of chips of this layout, the chips are positioned on the substrate so that the array of optical ports for the optical fibers are aligned to the optical apertures of the photodetectors near the edge of each chip. Additional electronic circuitry may be provided on the chip, or other electronic chips may be mounted on the package substrate, e.g. comprising clock and data recovery (CDR) circuitry, to form a receive optical sub-assembly (ROSA).

Figure 16:
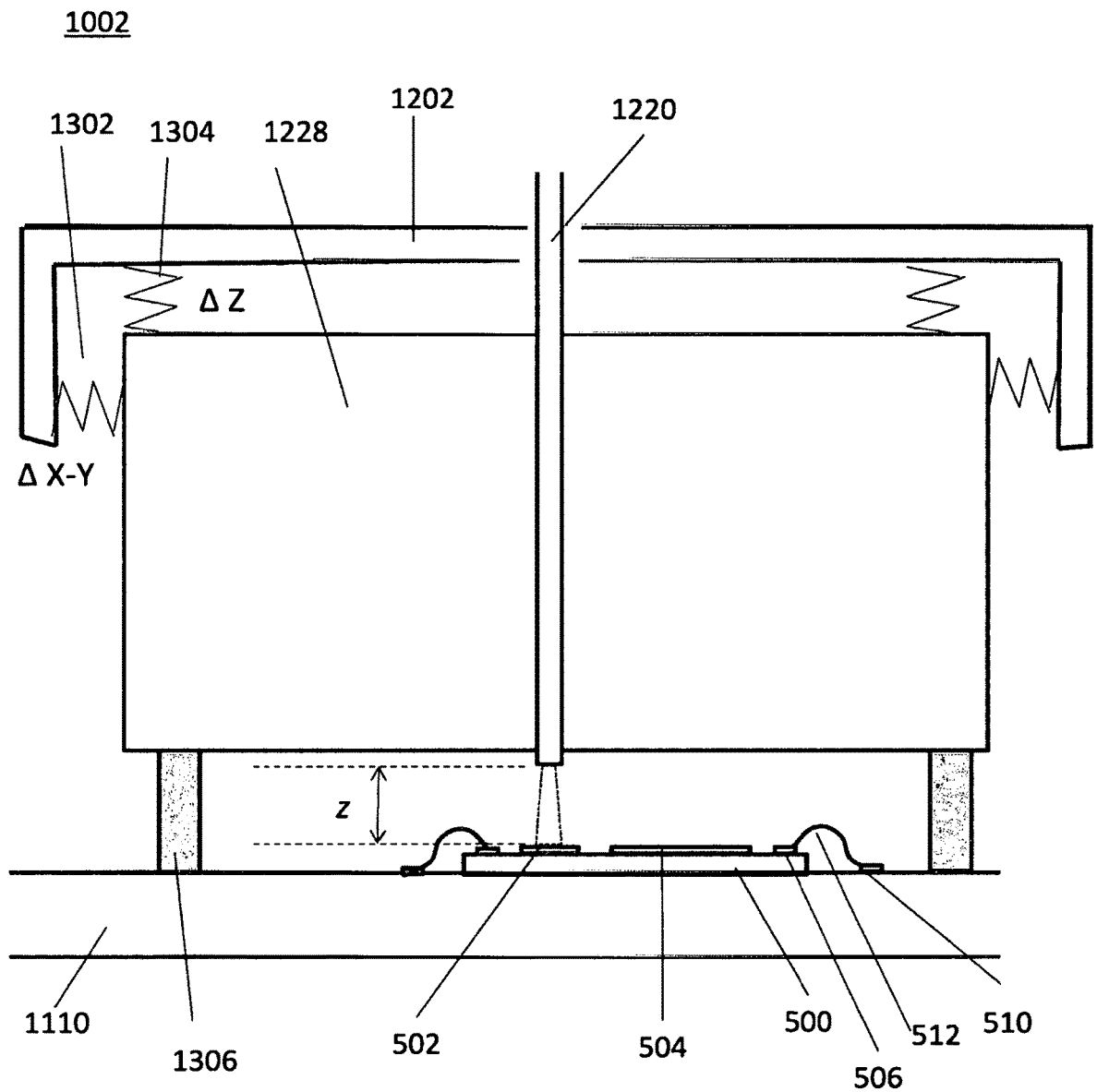
FIG. 16 shows an enlarged simplified schematic side view of part of the electro-optical module assembly of FIG. 14 to illustrate components of the alignment means.

FIG. 16 shows an enlarged and simplified schematic cross-sectional view of part of FIG. 14 to show x-y-z alignment of one fiber and one optical detector in an assembly of an electro-optical module and a fiber optic male connector according to the second embodiment, in which the photonic integrated circuit (chip) 500 comprises an optical detector having a layout similar to that shown in FIG. 15, comprising a photo-diode 502 and adjacent electronic circuitry 504. The chip 500 is attached to the ceramic substrate 1110 and electrically connected to conductive tracks 510 of the substrate by wirebonds 512 extending from bond pads 506 of the chip 500. As an example, the optical aperture of the photo-diode detector 502 may be 20 µm diameter. For example, the chips may be backside thinned, e.g. by chemical mechanical polishing, to a thickness of e.g. 125 µm 3 µm. The outside diameter of the optical fiber is typically 125 µm, and the spot size of the optical output from the optical fiber may be 10 µm at the fiber face, from which the optical beam diverges. The outside diameter of the ferrule 1126 of the optical fiber connector may be e.g. ~1 mm. To accommodate four fiber pigtails using standard types of commercially available connector components, the lateral dimensions of the electro-optical module may be, e.g. 9 mm×9 mm or 7 mm×7 mm. To account for lateral tolerances, the mounting of the ferrule carrying the fiber within the fiber optic connector provides for some lateral play of a few microns, indicated as Δx-y, represented schematically by spring elements 1302 between the ferrule 1228 and the connector body 1202. Similarly, to accommodate the thickness variation of the chip of e.g. ±3 µm, the mounting of the ferrule provides for a few microns of vertical play, indicated by Δz, and represented by spring elements 1304. Additionally, to ensure that the fiber end face does not inadvertently contact the optical aperture of the photonic device, and cause damage, spacers 1306 are provided adjacent the chip 500. These spacers 1306 engage alignment surfaces of the ferrule surrounding the optical fiber and are sized to ensure the optical fiber is appropriately spaced vertically, in the z direction, to match the beam spot size to the optical aperture of the photo-diode. For example, automated machine vision systems are used to measure the actual distance to the chip surface and spacers of an appropriate thickness are provided, to form a stop to prevent the end of the fiber from being inserted too far, and to provide the appropriate vertical spacing to match the spot size of the optical beam for effective optical coupling to the aperture of the photo-diode.

Figure 17:
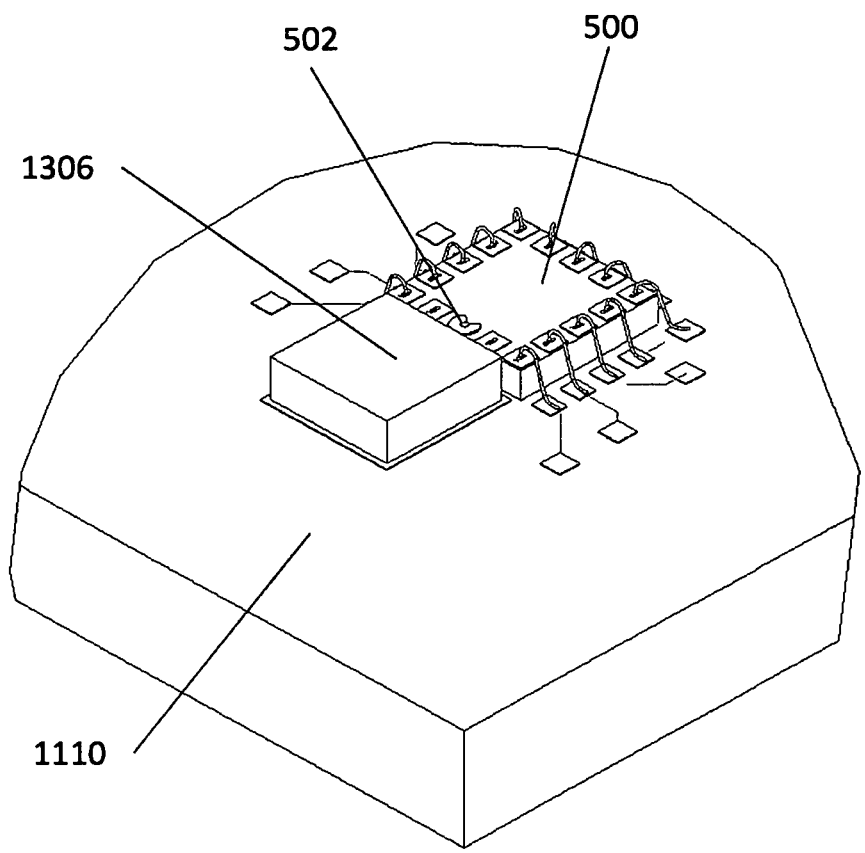
FIG. 17 shows a schematic view of an example of an electro-photonic chip mounted on a ceramic substrate.

For example, FIG. 17 shows a schematic view of an example of an electro-photonic chip 500 mounted on a ceramic substrate 1110 with a spacer 1306 in the form of a calibrated dummy chip that acts as a spacer for z axis alignment. To account for chip to chip thickness variations, the thickness of the calibrated dummy chip 1306 is selected based on the finished thickness of chip 500.

Figures 30, 31:
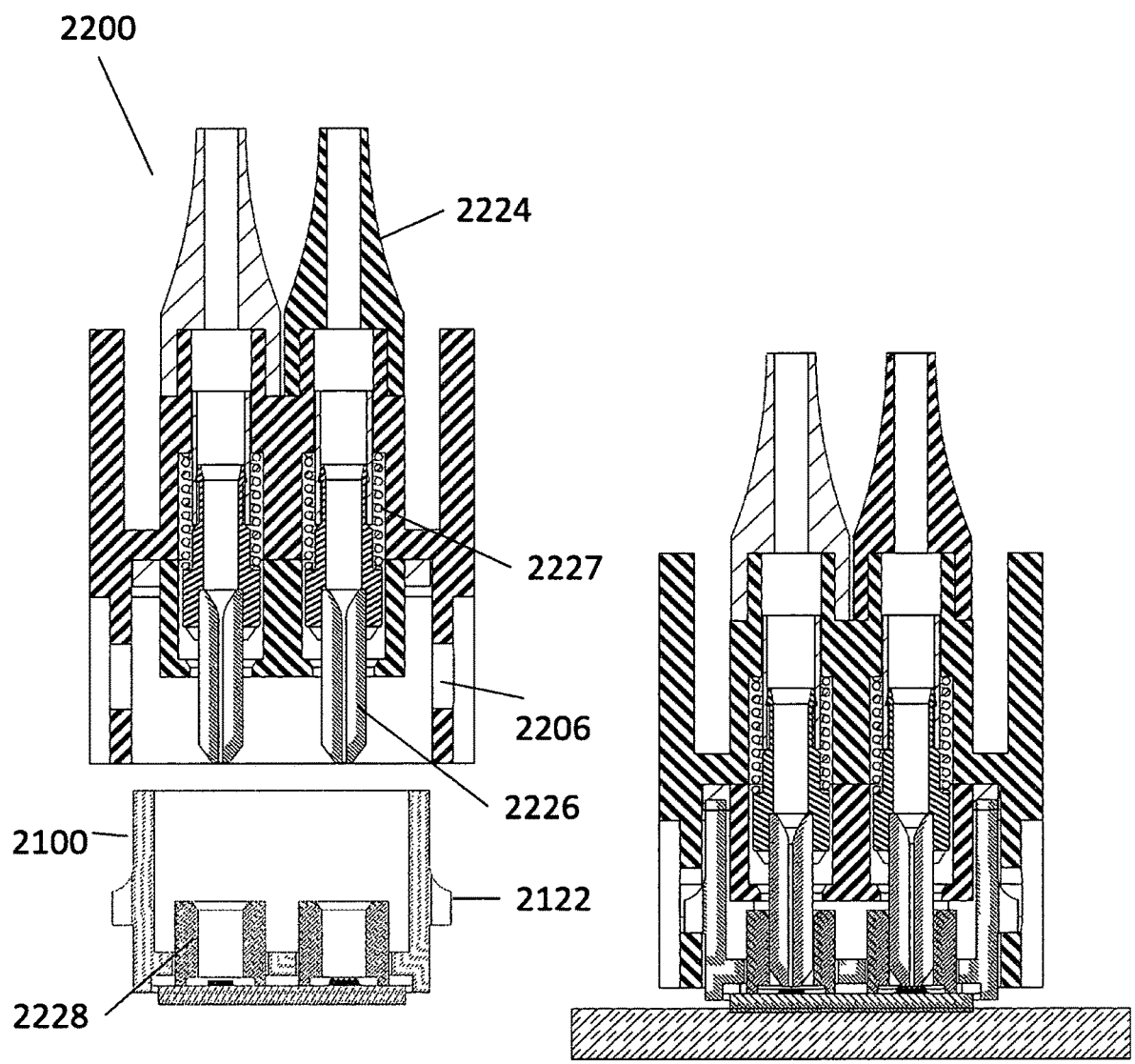
FIG. 30 shows a cross-sectional view of components comprising the electro-optical module and male optical connector of the third embodiment during assembly, showing internal components.
FIG. 31 shows a cross-sectional view of components comprising the electro-optical module and male optical connector of the third embodiment after assembly, showing internal components.

FIGS. 18 to 31 show a series of views of an assembly 2000 of an electro-optic module and a fiber optic connector of a third embodiment, and components thereof. Many features of this embodiment correspond to those of the first embodiment and are labelled with the same reference numerals incremented by 2000. As shown in FIGS. 18, 19 and 20, the assembly comprises a surface mount electro-optic module 2100 and a fiber optic connector 2200. The module 2100 provides an array of four ferrule sockets 2128 on the cap and a ball grid array 2114 on the underside. More details of the electro-optic module 2100 are shown in FIGS. 20 to 24, and more details of the fiber optic connector 2200 are shown in FIGS. 25 to 29. For example, the details of the form of the body of the module 2100 and the connector 2200 differ and its components differ from the first embodiment, e.g. the connector provides latch opening 2210 and the module 2100 provides latch protrusions 2122. FIG. 29 shows more details of the internal components of the male optical fiber connector including the fiber optic ferrules 2226 and the spring mechanism comprising compression springs 2227. More detailed cross-sectional views of the components of the assembly are shown in FIGS. 30 and 31. FIG. 30 shows a cross-sectional view of components comprising the electro-optical module and male optical connector of the third embodiment during assembly, showing internal components. FIG. 31 shows a cross-sectional view of the same components after assembly.

In the first embodiment described above, the latch means comprises a latch plate which is a separate component. In variants of this assembly, the latch elements are integrated with the electro-optical module and/or the optical connector as described above for the other embodiments.

In the electro-optical assemblies of the embodiments illustrated and described above, the array of optical ports of the cap of the package comprises ferrule sockets, and the optical fiber connector is a male fiber connector carrying the plurality of optical fiber connectors which comprises a corresponding array optical fiber ferrules. In alternative embodiments, the array of optical ports of the CBGA package module comprises an array of ferrules comprising optical fiber stubs aligned to optical emitters or receivers. Thus, for example, the ferrule sockets on the CBGA package are replaced with stub ferrules that have fibers fused with glass solder to withstand oven temperatures. The fiber stubs accept split sleeves of a standard ferrule to ferrule attachment. For example, in an embodiment, the ferrule stubs are hard attached to the cap of the optical CBGA package, and a high temperature index matching epoxy is used to reduce Fresnel losses between the fiber stub and optical aperture of the photodiode. If appropriate, a lensed fiber could also be fashioned into the ferrule stub on the photodiode end.

Figure 32:
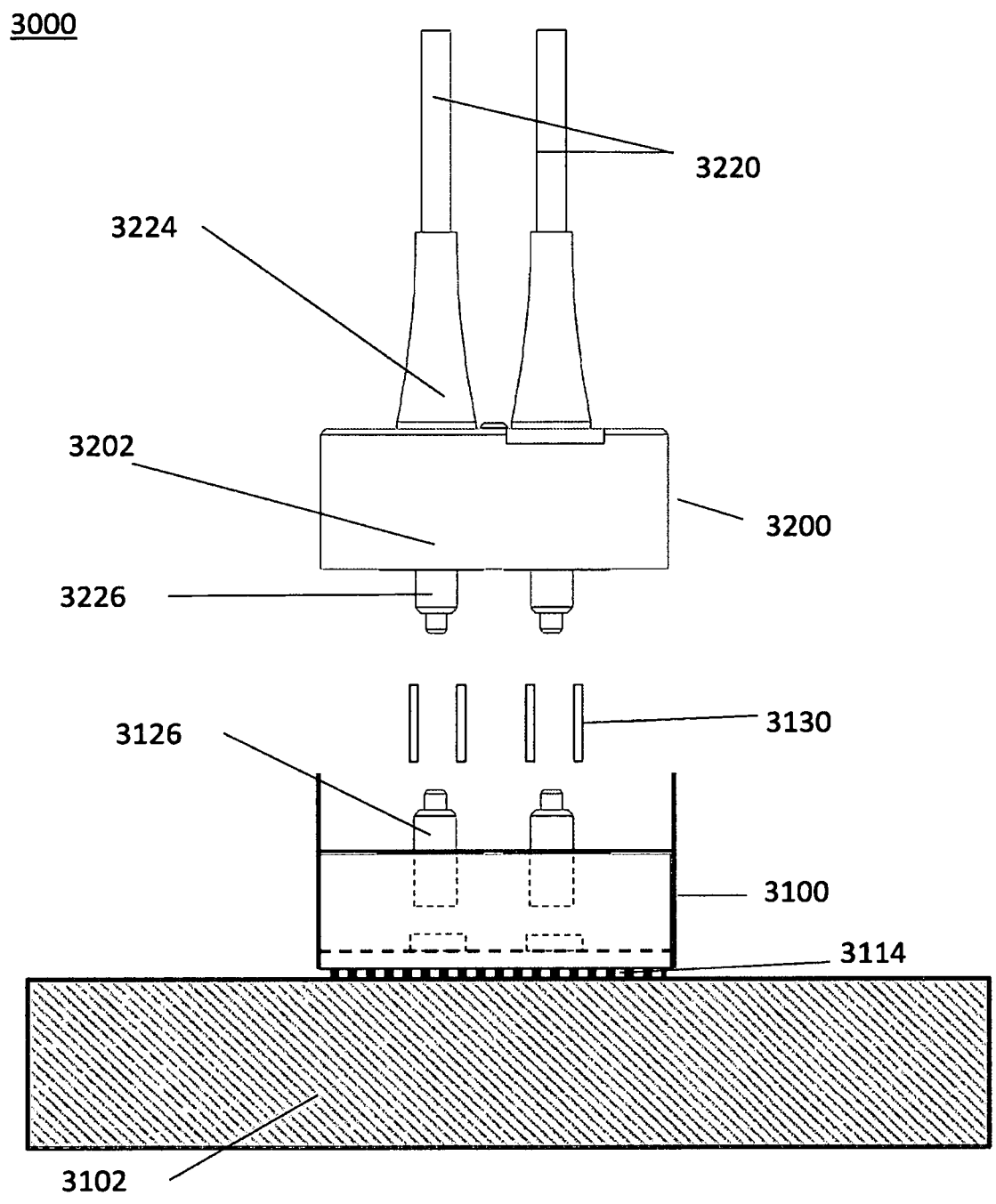
FIG. 32 shows a simplified schematic lateral cross-sectional view of components of an assembly of an electro-optic module and a fiber optic connector of a fourth embodiment, during alignment and insertion of the fiber optic connector into the electro-optic module.

FIG. 32 shows a simplified schematic lateral cross-sectional view of components of an assembly of an electro-optic module and a fiber optic connector of a fourth embodiment, during alignment and insertion of the fiber optic connector into the electro-optic module. Again, many components correspond to those of the first embodiment, and are labelled with the same reference numerals incremented by 3000. The male optical connector 3200 of this embodiment is the same as that of the second embodiment. On the other hand, the electro-optical module 3100 of this embodiment differs in that, instead of having an array of ferrule sockets, the module 3100 comprises an array of ferrules of optical fiber stubs 3126. The fiber optic ferrules of each of the fibers of the fiber connector 3200 are connected to the fiber optic ferrules of the electro-optic module using split sleeves 3130.

Thus, for example, the ferrule sockets on the CBGA package are replaced with stub ferrules that have fibers fused with glass solder to withstand oven temperatures. The fiber stubs accept split sleeves of a standard ferrule to ferrule attachment. For example, in an embodiment, the ferrule stubs are hard attached to the cap of the CBGA package, and a high temperature index matching epoxy is used to reduce Fresnel losses between the fiber stub and optical aperture of the photodiode. If appropriate, a lensed fiber could also be fashioned into the ferrule stub on the photodiode end.

For example, FIGS. 33 to 46 show a series of views of an assembly 4000 of an electro-optic module 4100 and a fiber optic connector 4200 of a fifth embodiment, and components thereof. Many features of this embodiment correspond to those of the first embodiment and are labelled with the same reference numerals incremented by 4000. As shown in FIGS. 33 and 34 the assembly comprises a surface mount electro-optic module 4100 and a fiber optic connector 2200. More details of the electro-optic module 4100 are shown in FIGS. 35 to 39. The module 4100 provides a cap with an array of four ferrules 4126, comprising fiber optic stubs on the top surface, and a ball grid array 4114 on the underside.

Figures 45, 46:
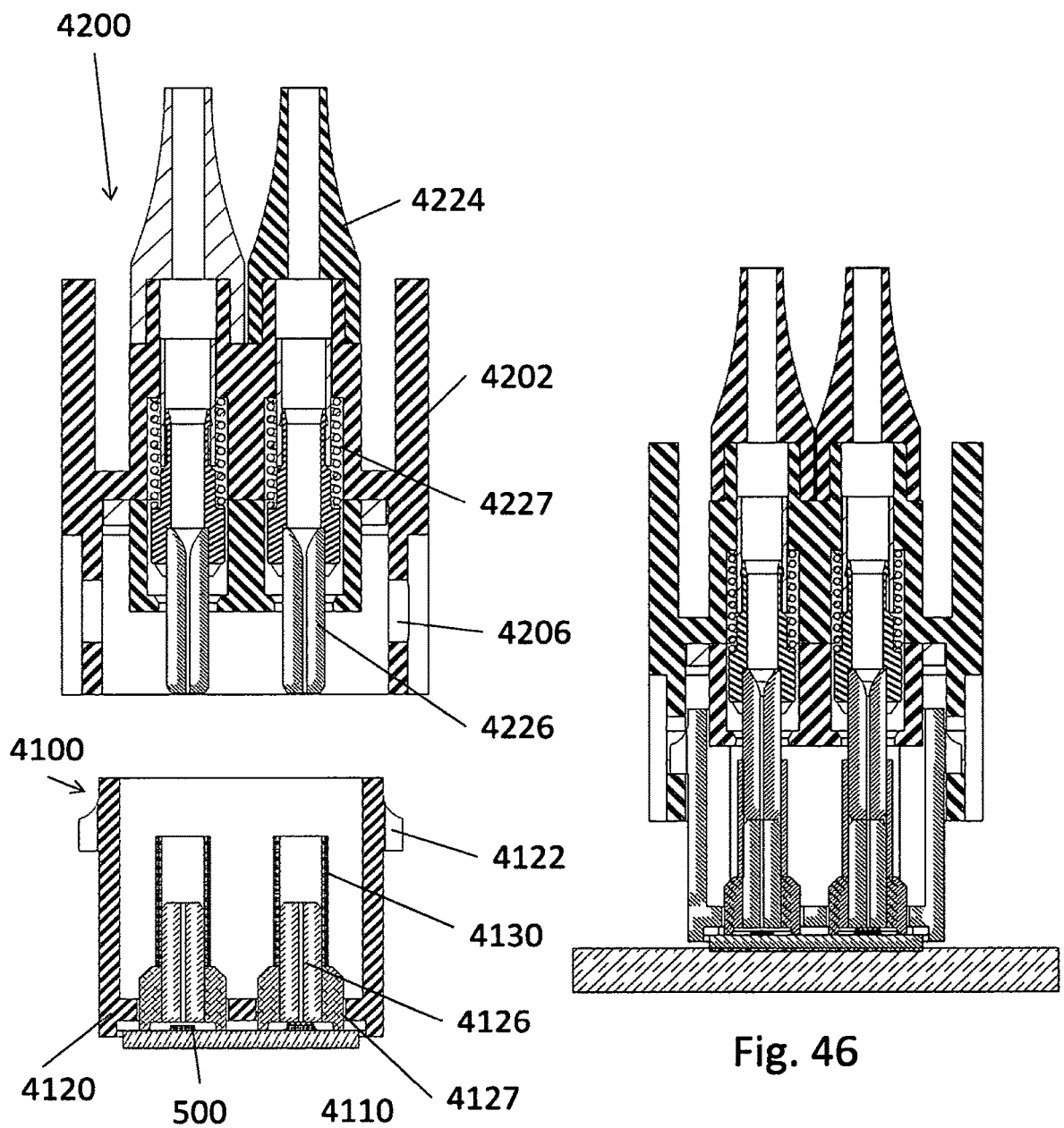
FIG. 45 shows a cross-sectional view of components comprising the electro-optical module and male optical connector of the fifth embodiment during assembly, showing internal components.
FIG. 46 shows a cross-sectional view of components comprising the electro-optical module and male optical connector of the fifth embodiment after assembly, showing internal components.

As shown in FIG. 39, an array of electro-optical chips 500 are mounted on the ceramic substrate 4110, and ferrules 4126 of fiber optic stubs are mounted over the chips with ferrule flanges 4127. More details of the fiber optic connector 4200 are shown in FIGS. 40 to 44. FIG. 44 shows more details of the internal components of the male optical fiber connector including the fiber optic ferrules 4226 and the spring mechanism comprising compression springs 4227, sleeves 4229, gasket 4209. The connector body or housing 4202 is secured to the inner body or frame 4203 with fastener 4207. Ferrules 4126 and 4226 of the surface mount module and of the fiber optic connector are, for example, 1.25 mm chamfered ferrules. More detailed cross-sectional views of the components of the assembly are shown in FIGS. 45 and 46. FIG. 45 shows a cross-sectional view of components comprising the electro-optical module 4100 and male optical connector 4200 of the third embodiment during assembly, showing internal components, numbered as in FIGS. 33 to 44, and with the split sleeves 4130 in place over the ferrules 4126 of the fiber stubs. FIG. 46 shows a cross-sectional view of the same components after assembly, with the latches securing the connector to the electro-optical module, with the ferrules 4226 inserted into the split sleeves 4130 for optical coupling.

Surface mount electro-optic modules and fiber optic connectors of various embodiments are described above in which the optical fiber pigtails are surface mounted and vertically coupled to the electro-optical module through the optical connector. These embodiments are described by way of example only. Any specific dimensions of components mentioned above are also provide by way of example only. For future high-density data centre interconnect, it may be desirable to further miniaturize the electro-optical module and optical fiber connectors packaging. It will be appreciated that modifications may be made to these embodiments, e.g., for packaging of photonic integrated circuits of different layouts, for packaging of arrays of different numbers of photonic chips. For example, embodiments are described for a quad package arrangement of a 2×2 array of photonic integrated circuits comprising optical transmit or receive devices. It will be appreciated that the disclosed packaging is scalable for other numbers of devices and detachable optical fiber connectors with a corresponding number of optical fiber pigtails. Some elements of the embodiments described may be combined in different ways to provide variants of these embodiments, e.g. comprising different forms of latch means and alignment means.

Other electro-photonic chips with surface emitting or receiving devices may be configured differently, with the optical aperture of the emitter or detector centered or placed in another position on the chip. Alternatively, in other configurations, the optical devices may be laterally (edge) coupled to ports at one side of the substrate, e.g. for side emitting laser diodes, and emitter chips comprising a laser diode in combination with one or more of a modulator, optical waveguide, and associated electronics.

Thus, in another configuration, the optical fiber pigtails may be edge coupled to the electro-optical module. An example of an assembly of an embodiment comprising an edge coupled electro-optical module and its corresponding optical connector is described below with reference to FIGS. 47 to 52.

Figure 47:
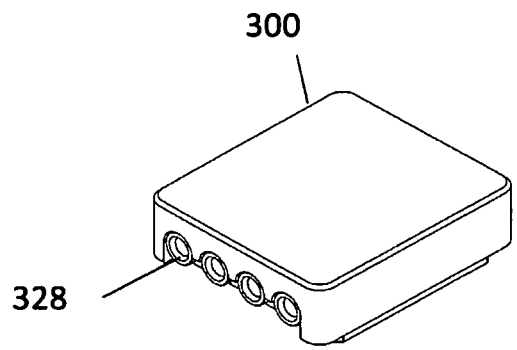
FIG. 47 shows a schematic isometric view of an electro-optical module of a further embodiment.
Figure 48:
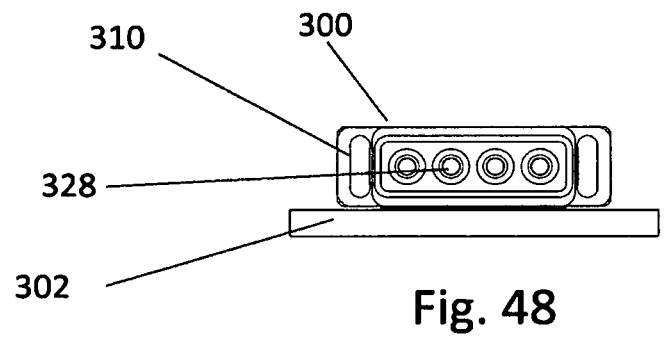
FIG. 48 shows a schematic side view of the electro-optical module of FIG. 47.
Figure 49:
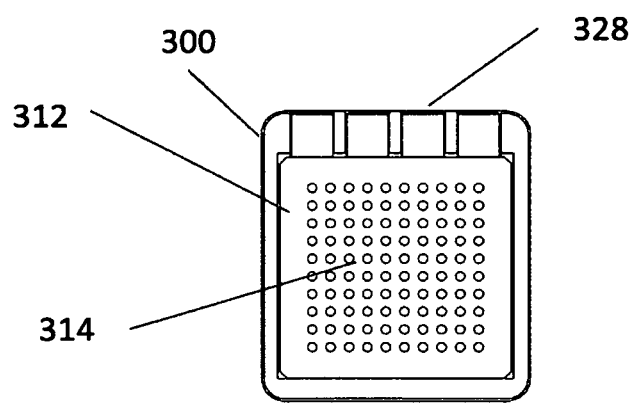
FIG. 49 shows a schematic underside view of the electro-optical module of FIG. 47.

FIG. 47 shows an isometric schematic view of an electro-optical module 300 of a third embodiment, in which the plurality of optical fibers are edge coupled to a BGA type package. That is, an array of four optical fiber ports comprising sockets 328 are provided along one side of the ceramic BGA package, as illustrated in the schematic side view shown in FIG. 48, which shows the module 300 comprising the array of optical fiber sockets 328, when it is surface mounted on a substrate, such as a PCB 302, with a latch plate 310 comprising latch openings for receiving latches of an optical fiber connector. As described for the module of the first embodiment, the electro-optical module 300 may be surface mounted and directly attached to the underlying substrate by a process comprising pick-and-place and solder reflow. FIG. 49 shows a schematic plan view of the underside 312 of the electro-optical module of FIG. 49 showing the ball grid array of ball connections 314, and the array of optical fiber sockets 328.

Figure 50:
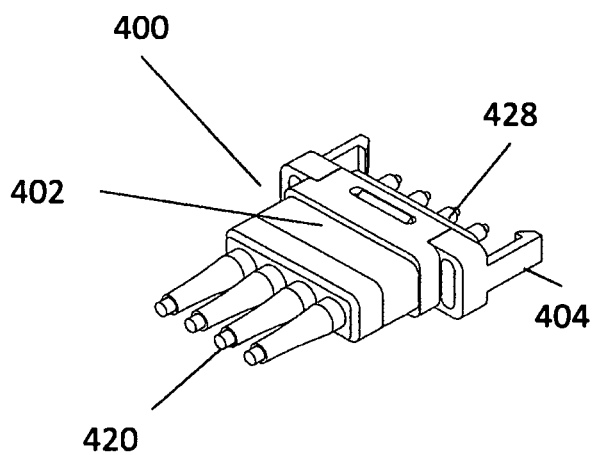
FIG. 50 shows a schematic isometric view of an optical connector for the electro-module of the further embodiment, with optical fibers and optical fiber connectors inserted.
Figure 51:
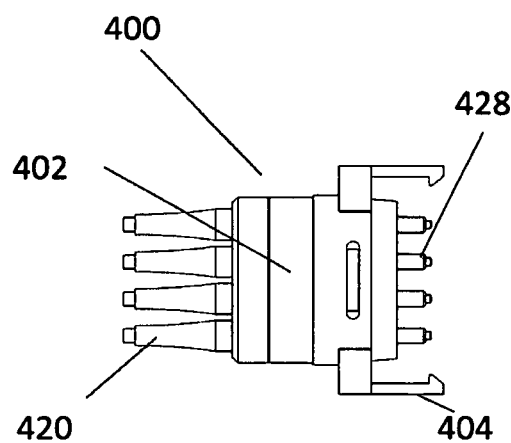
FIG. 51 shows a schematic top view of the optical connector of FIG. 50.
Figure 52:
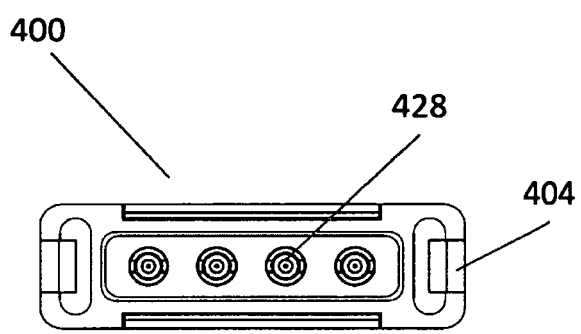
FIG. 52 shows a side view of the optical connector of FIG. 50.

FIG. 50 shows an isometric schematic view, and FIG. 51 shows a schematic top side view, of a male optical connector 400 for the electro-optical module 300 of the third embodiment. Four optical fibers 420 and optical fiber connectors 428 are inserted into the body 402 of the connector. FIG. 52 shows a corresponding schematic end view of the male optical connector 400 of the third embodiment, with optical fibers and optical fiber connectors 428 inserted. In this embodiment, the latch means comprises a pair of latch elements 404 extending from the body 402 of the optical connector, which mate with latch engaging surfaces of the electro-optical module to enable the two parts to be securely latched together with the optical fibers aligned to the optical transceivers. An assembly comprising an electro-optical module and fiber optical connector of this embodiment provides for edge coupling (i.e. lateral or side coupling) of the optical fiber pigtails to the PCB on which the assembly is mounted. As for the assemblies with vertically coupled optical fiber pigtails, the electro-optical module 300 is similarly fabricated, e.g. in the form of a CBGA package, and surface mounted on the PCB by conventional pick-and-place and solder reflow processes. Latch means such as the latch arrangement illustrated allow the optical fiber connector to be detachably secured to the electro-optical module. It will be appreciated that this edge coupled connector geometry may be used when the electro-optical module comprises edge emitting optical device, or for applications where there is limited vertical spacing above the PCB to accommodate the fiber optic pigtails. As described for the vertically coupled connector geometry, if required, the latch means and alignment means for an edge coupled connector configuration comprise components comprising mating surfaces of the electro-optical module and the optical fiber connector, together with alignment means, such as spacers and spring components, which provide for alignment of the optical fibers with the optical apertures of an optical emitter or optical receiver of each electro-optical device, i.e. to provide precision alignment in each of the x, y and z directions for effective optical coupling of each optical fiber to its respective optical emitter or optical receiver. As for the embodiments of a vertically coupled module, in alternative embodiments of an edge coupled module, the ferrule sockets of the electro-optical module may be replaced with ferrule stubs, and split sleeves are used to connect the ferrules of the package module and the ferrules of the optical connector.

While specific embodiments of electro-optical modules, fiber optic connectors, and assemblies of electro-optical modules and fiber optic connectors have been described in detail, by way of example, it will be appreciated that elements of these embodiments may be combined in different ways to provide alternative embodiments, and modifications may be made to these embodiments, e.g. for packaging of photonic integrated circuits of different layouts, for packaging of arrays of different numbers of photonic chips, and fiber optic connectors carrying corresponding different numbers of optical fibers.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. An electro-optical assembly for high-density, high-speed data interconnect applications, comprising:
    an electro-optical module and detachable fiber optic connector carrying a plurality of single mode fiber optic pigtails,
    the electro-optical module comprising a surface mount ball grid array package having a body comprising a package substrate and a cap;
    an array of semiconductor chips comprising photonic integrated circuits mounted on a front side of the package substrate, each photonic integrated circuit comprising a photonic device and associated-electronic circuitry, and each photonic device comprising at least one of; an optical emitter having an optical output aperture and an optical receiver having an optical input aperture;
    a plurality of surface mount contact areas comprising a ball grid array provided on a back side of the package substrate, electrical interconnections extending through the package substrate, electrically interconnecting each photonic integrated circuit to respective ball connections of the ball grid array;
    and
    an array of optical ports comprising ferrule sockets that are bonded to the front surface of the package substrate, aligned to said optical input/output apertures of each photonic device, and openings in the cap that receive the ferrule sockets;
    and
    the detachable fiber optic connector comprising a connector body carrying the plurality of single mode fiber optic pigtails and connector ferrules of individual optical fibers arranged as an array matching the array of optical ports of the electro-optical module, connector ferrules of each optical fiber being removably inserted into corresponding ferrule sockets of the electro-optical module.

2. The electro-optical assembly of claim 1, wherein the ferrule sockets comprise ferrule flanges, fiber stubs and split sleeves into which the connector ferrules of the optical fiber connector are removable inserted.

3. The electro-optical assembly of claim 1, wherein the package substrate and the cap comprise a ceramic material.

4. The electro-optical assembly of claim 3, wherein the ferrule sockets comprise ceramic ferrule sockets.

5. The electro-optical assembly of claim 1, further comprising alignment and latch elements, the alignment elements being configured for x-y-z positioning of each optical fiber and the corresponding optical input/output aperture of one of the photonic devices for optical coupling, and the latch elements for removably securing the optical fiber connector to the electro-optical module.

6. The electro-optical assembly of claim 5, wherein the alignment elements comprise spacers and resiliently flexible elements for x-y-z positioning of the optical fiber.

7. The electro-optical module of claim 1, wherein the ferrule sockets are recessed within said openings in the cap.

8. An electro-optical module for high-density, high-speed data interconnect applications comprising:
- a surface mount ball grid array package having a body comprising a package substrate and a cap;
- an array of semiconductor chips comprising photonic integrated circuits mounted on a front side of the package substrate, each photonic integrated circuit comprising a photonic device and associated electronic circuitry, each photonic device comprising at least one of; an optical emitter having an optical output aperture and an optical receiver having an optical input aperture;
- a plurality of surface mount contact areas comprising a ball grid array provided on a back side of the package substrate, electrical interconnections extending through the package substrate, electrically interconnecting each photonic integrated circuit to respective ball connections of the ball grid array;
and
- an array of optical ports comprising ferrule sockets that are bonded tot the front surface of the package substrate, aligned to said optical input/output apertures of each photonic device, and openings in the cap that receive the ferrule sockets.

9. The electro-optical module of claim 8, wherein the package substrate and the cap of the package body comprise a ceramic material.

10. The electro-optical module of claim 8, wherein said ferrule sockets comprise a ceramic material.

11. The electro-optical module of claim 8, wherein the ball grid array package is a ceramic ball grid array package, wherein the package substrate and the cap comprise a ceramic material, and said ferrule sockets of the optical ports are ceramic ferrule sockets which are bonded to the package substrate by gold-tin eutectic solder, and the cap is bonded to the package substrate by gold-tin eutectic solder, so that the ceramic ball grid array package can withstand temperatures of surface mounting on a printed circuit board by surface mount technology comprising solder reflow of the ball grid array.

12. The electro-optical module as defined in claim 11, wherein the ferrule sockets are recessed within the openings in the cap of the ceramic ball grid array package to provide a form factor compatible with surface mount technology using tape and reel format.

13. An electro-optical module for high-density, high-speed optical data interconnect applications, comprising:
- a ceramic ball grid array package having a body comprising a package substrate and a cap, the package substrate having a front surface and a back surface,
- an array of a plurality of semiconductor chips mounted on the front surface of the package substrate, each semiconductor chip comprising a photonic integrated circuit comprising an optical device and electronic circuitry, each of said optical devices comprising at least one of; a light emitting device having an optical output aperture and a light receiving device having an optical input aperture;
- the back surface of the package substrate comprising a ball grid array of a plurality of solder ball connections;
- a plurality of electrically conductive interconnections extending through the substrate and interconnecting each photonic integrated circuit to corresponding der ball connections of the ball grid array; and
- the cap extending over and covering the package substrate, attached around a periphery of the package substrate and a surface of the cap comprising an array of a plurality of optical ports comprising ferrule sockets that are bonded to the front surface of the package substrate, aligned to said optical input/output apertures of the optical devices, and openings in the cap that receive the ferrule sockets.

14. The electro-optical module of claim 13, wherein the array of optical devices comprises a n×m array of surface-coupled optical devices arranged over the package substrate and wherein the array of the plurality of optical ports comprises a corresponding arrangement of a n×m array of optical ports, said openings in the cap extending through a top surface of the cap.

15. The electro-optical module of claim 14, wherein the n×m array of optical devices comprises a 2×2 array of optical devices, and the optical ports are arranged as a corresponding 2×2 array.

16. The electro-optical module of claim 13, wherein the array of optical devices comprises an array of n optical devices over the package substrate, said optical devices being edge-coupled optical devices, wherein the array of the plurality of optical ports comprises a 1×n array of optical ports arranged along a side of the package substrate, and wherein said openings in the cap are arranged along a side of the cap.

17. An assembly of an electro-optical module as defined in claim 13, and a detachable optical connector carrying a plurality of optical fiber pigtails comprising single mode optical fibers,
- wherein the electro-optical module is surface mounted on a printed circuit board in proximity to other electronic devices, and
- the detachable optical connector comprises a connector body carrying the plurality of optical fiber pigtails, wherein each single mode optical fiber has a connector ferrule, and the connector ferrules are configured as an array to plug into said ferrule sockets of the electro-optical module, and wherein the electro-optical module and detachable optical connector comprise alignment and latch means for securing together the electro-optical module and the detachable optical connector, with said single mode optical fibers optically coupled to the optical input/output apertures of the optical devices of the electro-optical module.

18. The assembly of claim 17, wherein the alignment and latch means comprises alignment surfaces of the electro-optical module and of the detachable connector for x-y-z positioning of each single mode optical fiber and the corresponding optical input/output aperture of one of the optical devices for effective optical coupling, and latch elements for removably attaching the optical fiber connector to the electro-optical module.

19. The assembly of claim 17, wherein the alignment means comprise spacers and resiliently flexible elements for x-y-z positioning of each single mode optical fiber.

20. The assembly claim 17, wherein the electro-optical module comprises a 2×2 array of photonic integrated circuits, and each photonic integrated circuit comprises one of a 25G transmit device and a 25G receive device, whereby the electro-optical module provides a 100G module.

21. The assembly of claim 20, wherein the surface mount ceramic ball grid array package has a quad form factor, having lateral dimensions of 10 mm×10 mm or less.

22. The assembly of claim 17, wherein said optical devices are surface-coupled optical devices, the package body having a vertically coupled configuration, wherein said optical ports are provided on a top surface of the cap, and the optical fiber pigtails comprise high flexibility, tight bend radius optical fibers.

23. The assembly of claim 17, wherein said optical devices are edge-coupled devices, the electro-optical module having a laterally coupled configuration wherein said optical ports are arranged on a side of the cap.

24. The electro-optical module of claim 13, mounted on a printed circuit board, wherein the electro-optical module comprises materials selected to withstand temperatures of surface mounting of the electro-optical module on the printed circuit board by solder reflow of the ball grid array.

25. The electro-optical module of claim 13, wherein the surface mount ceramic ball grid array package is surface mounted on a printed circuit board in proximity to at least one other electronic device comprising a core switching chip with which the electro-optical module communicates.

26. The electro-optical module of claim 13, wherein the semiconductor chips are die-attached to the front surface of the package substrate, and each photonic integrated circuit is interconnected by wire bonds to said electrically conductive interconnections extending through the substrate.

27. The electro-optical module of claim 13, wherein the ferrule sockets comprise ceramic ferrule sockets, which are bonded to the package substrate with gold-tin eutectic solder.

28. The electro-optical module of claim 13, wherein the ferrule sockets comprise ceramic ferrule flanges, fiber optic stubs and split sleeves, wherein the ceramic ferrule flanges are bonded to the package substrate with gold-tin eutectic solder.

29. The electro-optical module of claim 13, wherein said optical devices are edge-coupled optical devices, the electro-optical module having a laterally coupled configuration wherein said optical ports are arranged on a side of the cap.

30. The electro-optical module of claim 13, wherein the ferrule sockets are recessed within said openings in the cap.

\* \* \* \* \*

UNITED STATES PATENT AND TRADEMARK OFFICE
CERTIFICATE OF CORRECTION

PATENT NO. : 11,092,762 B2
APPLICATION NO. : 16/491712
DATED : August 17, 2021
INVENTOR(S) : Gudmundur A. Hjartarson and Craig Elliott It is certified that error appears in the above-identified patent and that said Letters Patent is hereby corrected as shown below:

On the Title Page

Item (57) In the abstract, Line 4: "on a printed circuity boards" should read – on a printed circuit board –

Item (57) In the abstract, Line 6: "housing array of" should read – housing an array of –

In the Claims

Column 18, Line 51: "are removable inserted." should read – are removably inserted. –

Column 19, Line 62: "to corresponding der" should read – to corresponding solder –

Signed and Sealed this
Third Day of January, 2023

Katherine Kelly Vidal
Director of the United States Patent and Trademark Office